United States Patent
Diehl et al.

(10) Patent No.: US 11,787,702 B2
(45) Date of Patent: Oct. 17, 2023

(54) SNTIO3 MATERIAL, METHOD OF PREPARATION THEREOF, USE THEREOF AS FERROELECTRIC MATERIAL AND DEVICE COMPRISING A FERROELECTRIC MATERIAL

(71) Applicant: MAX-PLANCK-GESELLSCHAFT ZUR FÖRDERUNG DER WISSENSCHAFTEN E.V., Munich (DE)

(72) Inventors: Leo Peter Otto Diehl, Munich (DE); Bettina Valeska Lotsch, Pähl (DE); Florian Pielnhofer, Regensburg (DE)

(73) Assignee: MAX-PLANCK-GESELLSCHAFT ZUR FÖRDERUNG DER WISSENSCHAFTEN E.V., Munich (DE)

( * ) Notice: Subject to any disclaimer, the term of this patent is extended or adjusted under 35 U.S.C. 154(b) by 148 days.

(21) Appl. No.: 17/052,866

(22) PCT Filed: May 2, 2019

(86) PCT No.: PCT/EP2019/061231
  § 371 (c)(1),
  (2) Date: Nov. 4, 2020

(87) PCT Pub. No.: WO2019/211372
  PCT Pub. Date: Nov. 7, 2019

(65) Prior Publication Data
  US 2021/0230012 A1    Jul. 29, 2021

(30) Foreign Application Priority Data
  May 4, 2018  (EP) .................................. 18170903

(51) Int. Cl.
  *C01G 23/00*  (2006.01)

(52) U.S. Cl.
  CPC ........ *C01G 23/003* (2013.01); *C01P 2002/34* (2013.01); *C01P 2004/41* (2013.01); *C01P 2006/42* (2013.01)

(58) Field of Classification Search
  CPC ...................................................... C04B 35/46
  See application file for complete search history.

(56) References Cited

U.S. PATENT DOCUMENTS

2009/0291324 A1* 11/2009 Cohen .................. C04B 35/472
                                                    423/598

FOREIGN PATENT DOCUMENTS

| JP | 2002-029838 A | 1/2002 |
| JP | 2003-146660 A | 5/2003 |

(Continued)

OTHER PUBLICATIONS

Matar eta., "First principles studies of SnTiO3 perovskite as potential environmentally benign ferroelectric material", Chemical Physics, 355 (2009), pp. 43-49.*
Sirajudheen et al., "Synthesis Characterization and Photocatalytic Activity of SnTiO3 Prepared by Co-Precipitation Peroxide Method", Chemical Sciences Journal, vol. 6, Issue 4, Nov. 9, 2015, pp. 1-3.*
International Search Report and Written Opinion dated Jul. 1, 2019, from International Application No. PCT/EP2019/061231, 11 pages.

(Continued)

*Primary Examiner* — Khanh T Nguyen
(74) *Attorney, Agent, or Firm* — Meunier Carlin & Curfman LLC

(57) ABSTRACT

The present invention relates to a material of the formula $SnTiO_3$ having a crystal structure comprised of layers, wherein the layers comprise Sn(II) ions, Ti(IV) ions and edge-sharing $O_6$-octahedra, the edge-sharing $O_6$-octahedra form a sub-layer, the Ti(IV) ions are located within $\tfrac{2}{3}$ of the edge-sharing $O_6$-octahedra, thus forming edge-sharing $TiO_6$-octahedra, the edge-sharing $TiO_6$-octahedra form a honeycomb structure within the sub-layer, the honeycomb structure comprising hexagons with Ti(IV)-vacancies within the hexagons, the Sn(II) ions are located above and below (Continued)

the Ti(IV)-vacancies with respect to the sub-layer, the Ti(IV) ions are optionally substituted with M, M is one or more elements selected from Group 4 and Group 14 elements, and the crystal structure satisfies at least one of the following features (i) and (ii): (i) the Sn(II) ions have a tetrahedral coordination sphere involving three O ions of the layer and the electron lone pair of the Sn(II) ions which is situated at an apical position relative to the three O ions of the layer, (ii) the layers are stacked so that each layer is translated relative to each adjacent layer by a stacking vector S1 or a stacking vector S2, the centers of adjacent hexagons form a parallelogram with a side having a length x and side having a length y, the stacking vector S1 is a combined translation along the side having the length x by ⅔ x and along the side having a lengthy by ⅓ y, the stacking vector S2 is a combined translation along the side having the length x by ⅓ x and along the side having a lengthy by ⅔ y, and the crystal structure comprises layers translated relative to adjacent layers by the stacking vector S1 and layers translated relative to adjacent layers by the stacking vector S2. The present invention is further directed to a material of the formula $SnTiO_3$ having a tetragonal perovskite-type crystal structure, a method for the preparation of $SnTiO_3$, a device comprising a ferroelectric material and a use of the material of the formula $SnTiO_3$ in a ferroelectric element.

16 Claims, 27 Drawing Sheets

(56) References Cited

FOREIGN PATENT DOCUMENTS

| | | | | |
|---|---|---|---|---|
| JP | 2008-254961 A | | 10/2008 | |
| JP | 2010080758 A | * | 4/2010 | ............ C04B 35/46 |
| JP | 2022-029838 A | | 2/2022 | |

OTHER PUBLICATIONS

Agarwal, R. et al. "Room-temperature relaxor ferroelectricity and photovoltaic effects in tin titanate directly deposited on a silicon substrate", Physical Review B, vol. 97, No. 5 (2018).
Unruan, S. et al. "On the application of synchrotron X-Ray absorption spectroscopy technique for characterization of mixed SnO-TiO 2 powders", Integrated Ferroelectrics, vol. 175, No. 1 (2016).
Sirajudheen, P. et al. "Synthesis Characterization and Photocatalytic Activity of SnTi03 Prepare by Co-Precipitation Peroxide Method", Chemical Science Journal, Astonjournals, vol. 6, No. 4 (2015).
Hosogi, Y. et al. "Photocatalytic Activities of Layered Titanates and Niobates Ion-Exchanged with Sn 2+ under Visible Light Irradiation", Journal of Physical Chemistry C, vol. 112, No. 45 (2008).
Fix, T. et al. "Structural and Dielectric Properties of SnTiO 3, a Putative Ferroelectric", Crystal Growth & Design, vol. 11, No. 5(2011).
Kumada, N. et al. "Preparation and crystal structure of a new tin titanate containing Sn 2+; Sn 2+TiO 4", Department of Research Interdisciplinary, Graduate School of Medicine and Engineering, University of Yamanashi, Miyamae-cho 7, Kofu 400-8511 (2009).
Chang, S. "Atomic deposition of environmentally benign Sn TiOx as a potential ferroelectric material", Journal of Vacuum Science & Technology A: Vacuum, Surfaces, and Films 34, 01A119 (2016).
Office Action with English translation dated Sep. 27, 2022, for Japanese Application No. 2021-510538.
Beenakumari, K. S. "Visible Light driven Tin Titanate Photo-Catalyst Prepared by Co-Precipitation Method." World Applied Sciences Journal (2013). 8 pages.
Gardner, J., et al. "Tin titanate—the hunt for a new ferroelectric perovskite." Reports on Progress in Physics 82.9 (2019): 092501.
Qing, Huang Xiao. "A Challenge to Prepare Perovskite Structure $SnTiO_3$" Dissertation submitted to the Jilin University. 2013. Abstract. [retrieved on Dec. 16, 2022]. Retrieved from the internet: <URL: https://www.dissertationtopic.net/doc/1702829>.
Office Action dated Apr. 15, 2023, in Chinese Application No. 201980030377.2.
Notice of Reasons of Rejection dated Jun. 27, 2023, in Japanese Patent Application No. 2021-510538.

* cited by examiner

SNTIO3 MATERIAL, METHOD OF PREPARATION THEREOF, USE THEREOF AS FERROELECTRIC MATERIAL AND DEVICE COMPRISING A FERROELECTRIC MATERIAL

CROSS-REFERENCE TO RELATED APPLICATIONS

This application is a United States National Phase Patent Application of International Patent Application Number PCT/EP2019/061231, filed on May 2, 2019, which claims priority to EP Patent Application No. 18170903.1, filed on May 4, 2018, both of which are incorporated by reference herein in their entireties.

TECHNICAL FIELD

The present invention is directed towards a material of the formula $SnTiO_3$ or $SnTi_{1-x}M_xO_3$ (with M and x as defined herein), which is a tin titanate a method of preparation thereof, a use thereof in a ferroelectric element and a device comprising a ferroelectric material.

STATE OF THE ART

Titanates have proven to be one of the most diverse classes of materials, with applications from ferroelectrics and photocatalysts to thermoelectrics and batteries. In particular, $SnTiO_3$ is a promising ferroelectric material.

Generally, the implementation of Sn(II) remains challenging in the field of solid state chemistry, due to the low disproportionation temperature of Sn(II) to Sn(0) and Sn(IV) of about 350° C. However, the preparation of new materials usually occurs via solid state reactions at high temperatures. Therefore, few Sn(II) oxides have been successfully prepared. There is presently no method for preparing bulk $SnTiO_3$.

In Sirajudheen P. et al., *Chemical Science Journal* 6 (2015) 1, the authors claim to have prepared $SnTiO_3$ having a perovskite-type structure by a co-precipitation peroxide method. In the preparation method, the precipitate was calcined at 800° C. for 1 hour in a muffle furnace. This temperature is way above the disproportionation temperature and the oxidation temperature of Sn(II). Thus, under the given (oxidative) conditions, Sn(II) will be oxidized to Sn(IV) and, therefore, the formation of a structure containing Sn(II) can be ruled out. In addition, the formation of the claimed material is not proven by the analytical methods described therein, such as X-ray or electron diffraction methods.

Kumada et al., *Materials Research Bulletin* 44 (2009) 1298, describe the preparation of bulk Sn(II) titanate of the formula $Sn_2TiO_4$. Y. Hosogi et al., *Journal of Physical Chemistry C* 112 (2008) 17678, describe the preparation of layered Sn-exchanged alkali metal titanates and niobates by solid-state reactions.

More particularly, R. Agarwal et al., *Physical Review B* 97 (2018) 054109, and S. Chang et al., *Journal of Vacuum Science* (2016) 01A119-2, describe the preparation of $SnTiO_3$ thin films by atomic layer deposition and report on the ferroelectric properties of the deposited thin films. Chang et al. state that a lack of evidential peaks from the X-ray diffraction patterns of the $SnTiO_3$ film prevents drawing definite conclusions on the $SnTiO_3$ structure. Agarwal et al. use the method of Chang et al. and derive from the X-ray diffraction pattern that the obtained $SnTiO_3$ has an orthorhombic perovskite structure. Yet, the X-ray diffraction patterns and the fitting with simulated patterns may not allow an unambiguous elucidation of the structure of the prepared $SnTiO_3$ materials.

T. Fix et al. *Crystal Growth & Design* 11 (2011) 1422 report on the preparation of a thin film material of the composition $SnTiO_3$ by pulsed laser deposition. The authors derive from X-ray diffraction pattern and TEM images that the material has a triclinic ilmenite-type structure. The material prepared by T. Fix et al. does not exhibit ferroelectricity at room temperature. In such an ilmenite-type structure, Ti and Sn both exhibit an octahedral coordination sphere with a lattice parameter c of 1.456 nm, comparable to ilmenite $FeTiO_3$ itself with c of 1.408 nm. Hence, the structure reported by T. Fix et al. cannot be considered as a layered structure, i.e. a structure comprised of layers wherein the atoms within a layer have shorter distances compared to the distances to atoms of adjacent layers.

Thus, to the best of the inventors' knowledge, materials of the formula $SnTiO_3$ have only been prepared as thin films by atomic layer deposition or pulsed laser deposition. The industrial applicability of these techniques is limited. More particularly, the growth of thick films by atomic layer deposition or pulsed laser deposition is a slow and expensive process as it requires numerous cycles with the total reaction time depending on the cycle duration.

In addition, the structure of the material strongly depends on its process of preparation. More particularly, it is known that the crystal structure and crystallinity of a material obtained by atomic layer deposition is strongly affected by the deposition conditions, the reactants and the substrate. The stability of layers depends on the interaction with the substrate and the separation of the layer from the substrate may result in a structural change of the layer or even fail completely.

SUMMARY OF THE INVENTION

The present invention aims at providing a method of preparation of bulk $SnTiO_3$. The method is preferably scalable and susceptible to industrial application.

The inventors have found a new method for the preparation of bulk $SnTiO_3$ involving the steps of (i) preparing a layered alkali metal titanate, (ii) ion-exchanging the layered alkali metal titanate with a tin (II) salt to obtain a tin-exchanged alkali metal titanate, and (iii) dehydrating and subsequently annealing the tin-exchanged alkali metal titanate in an oxygen free atmosphere below the temperature at which the disproportionation of tin (II) occurs, thus obtaining $SnTiO_3$.

The preparation method of the present invention gives access to new bulk $SnTiO_3$ materials, which can be obtained in a high purity as free-standing materials. Surprisingly, the method of the present invention allows the preparation of new structures of $SnTiO_3$ and $SnTi_{1-x}M_xO_3$ (with M and x as defined herein) such as ilmenite-type derived layered structures and perovskite-type structures. The inventors have characterized these bulk $SnTiO_3$ materials. The bulk $SnTiO_3$ materials may have a non-centrosymmetric symmetry which is a pre-condition for ferroelectricity. Therefore, materials of the present invention are expected to exhibit ferroelectricity.

Thus, the present invention is also directed to the provision of bulk $SnTiO_3$ materials and their use as ferroelectric elements.

The invention is defined by the following aspects.

A first aspect of the present invention relates to a material of the formula $SnTiO_3$ having a crystal structure comprised of layers,
wherein
the layers comprise Sn(II) ions, Ti(IV) ions and edge-sharing $O_6$-octahedra,
the edge-sharing $O_6$-octahedra form a sub-layer,
the Ti(IV) ions are located within ⅔ of the edge-sharing $O_6$-octahedra, thus forming edge-sharing $TiO_6$-octahedra,
the edge-sharing $TiO_6$-octahedra form a honeycomb structure within the sub-layer, the honeycomb structure comprising hexagons with Ti(IV)-vacancies within the hexagons,
the Sn(II) ions are located above and below the Ti(IV)-vacancies with respect to the sub-layer,
the Ti(IV) ions are optionally substituted with M,
M is one or more elements selected from Group 4 and Group 14 elements, and
the crystal structure satisfies at least one of the following features (i) and (ii):
  (i) the Sn(II) ions have a tetrahedral coordination sphere involving three O ions of the layer and the electron lone pair of the Sn(II) ions which is situated at an apical position relative to the three O ions of the layer,
  (ii) the layers are stacked such that each layer is translated relative to each adjacent layer by a stacking vector S1 or a stacking vector S2,
  the centers of adjacent hexagons form a parallelogram with a side having a length x and side having a length y,
  the stacking vector S1 is a combined translation along the side having the length x by ⅔ x and along the side having a length y by ⅓ y,
  the stacking vector S2 is a combined translation along the side having the length x by ⅓ x and along the side having a length y by ⅔ y,
  and the crystal structure comprises layers translated relative to adjacent layers by the stacking vector S1 and layers translated relative to adjacent layers by the stacking vector S2.

Preferred embodiments of the material are described in the dependent claims 2 to 5.

In a second aspect, the present invention is directed to a material of the formula $SnTiO_3$ having a tetragonal perovskite-type crystal structure, wherein the Ti(IV) ions are optionally substituted with M, which is one or more elements selected from Group 4 and Group 14 elements.

A third aspect of the present invention is a method for the preparation of $SnTiO_3$, the method comprising the steps of
(1) Reacting an alkali metal salt and titanium(IV) oxide to obtain a layered alkali metal titanate;
(2) Ion-exchanging the layered alkali metal titanate with a tin (II) salt to obtain a tin-exchanged alkali metal titanate; and
(3) Dehydrating the tin-exchanged alkali metal titanate in an oxygen free atmosphere and subsequently annealing in an oxygen free atmosphere below the temperature at which the disproportionation of tin (II) occurs, thus obtaining $SnTiO_3$, wherein the titanium of the titanium(IV) oxide is optionally substituted with M, which is one or more elements selected from Group 4 and Group 14 elements.

Preferred embodiments of the method are described in the dependent claims 8 to 12.

In a fourth aspect, the present invention is directed to a material of the formula $SnTiO_3$ obtainable by the method of preparation according to the third aspect of the present invention, wherein Ti is optionally substituted with M, which is one or more elements selected from Group 4 and Group 14 elements.

A fifth aspect of the present invention relates to a device, comprising a ferroelectric material, wherein the ferroelectric material comprises at least one material selected from the group of the material according to the first aspect of the present invention and the material according to the second aspect of the present invention.

In a sixth aspect, the present invention is further directed to a use of the material according to the first and/or second aspect of the present invention in a ferroelectric element.

BRIEF DESCRIPTION OF FIGURES

FIG. 3a is a packing diagram illustrating a layer in the layered crystal structure of the material of the present invention along an axis perpendicular to the layer (c-axis) and showing the honeycomb structure formed of $O_6$-octahedra, the position of the Ti(IV) ions within the octahedra and the position of Sn(II) above and below the hexagons. The stacking vectors S1 and S2 and the basis vectors for the definition of the stacking vectors are indicated in FIG. 3a.

The positions of Ti(IV) ions are indicated by small Greek letters, the positions of Sn(II) ions are indicated by bold small Greek letters and the positions of O ions are indicated by small Latin letters. The position of a whole layer is indicated by capital Latin letters.

Figure 4A:
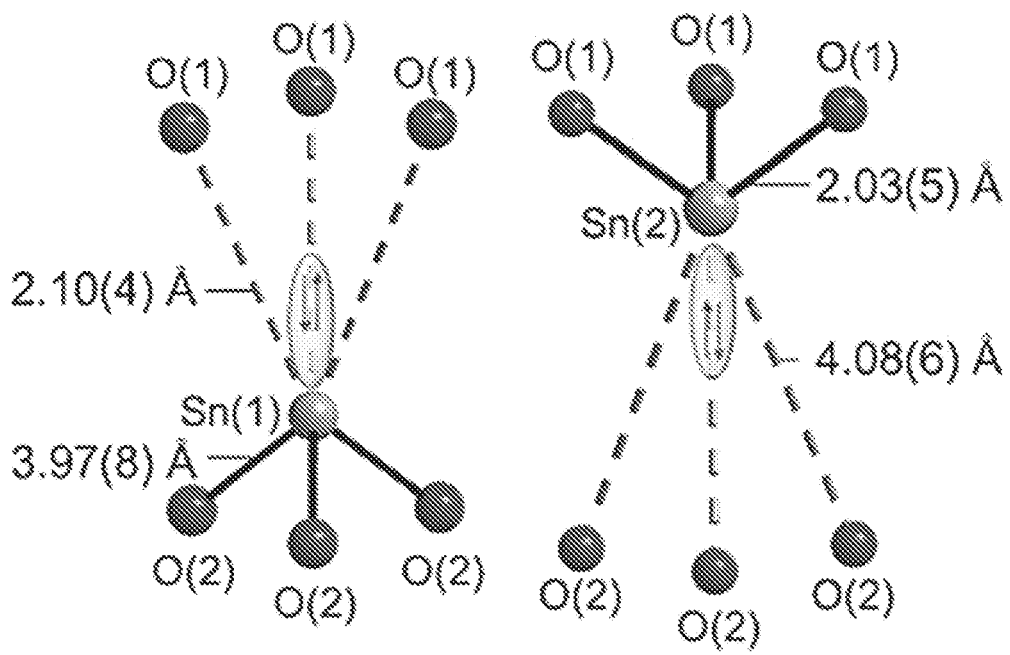
Figure 4B:
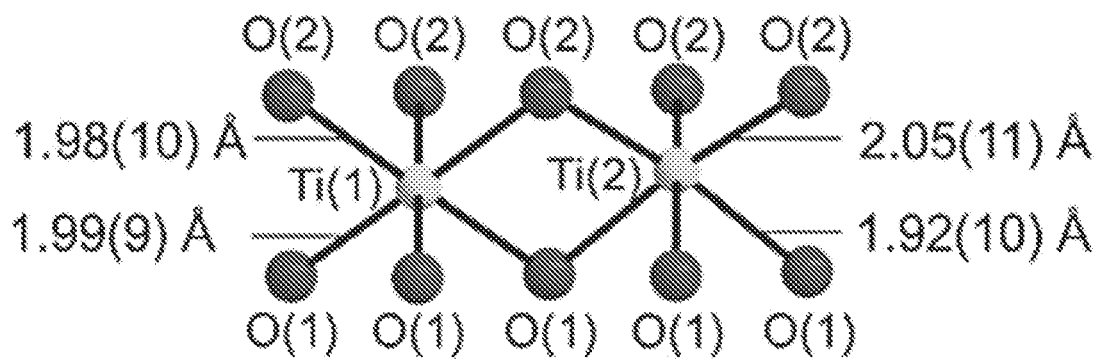

FIG. 4a shows the coordination spheres of Sn(II) in the crystal structure of the material according to the present invention. FIG. 4b shows the coordination spheres of Ti(IV) in the crystal structure of the material according to the present invention indicating the non-centrosymmetric symmetry.

Figure 5A:
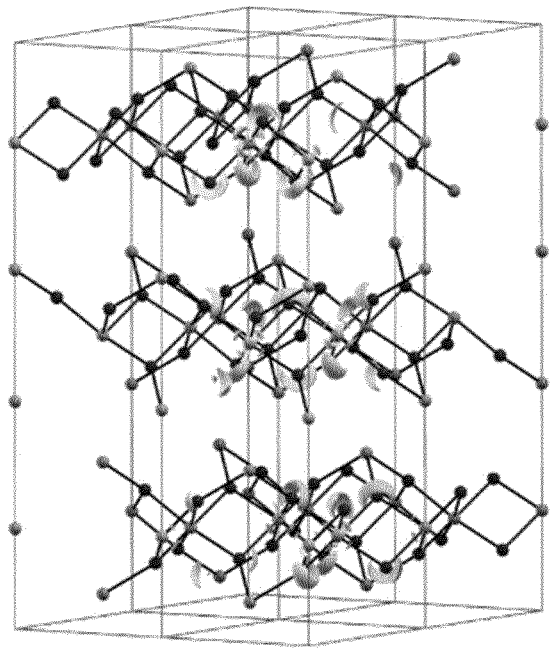
Figure 5B:
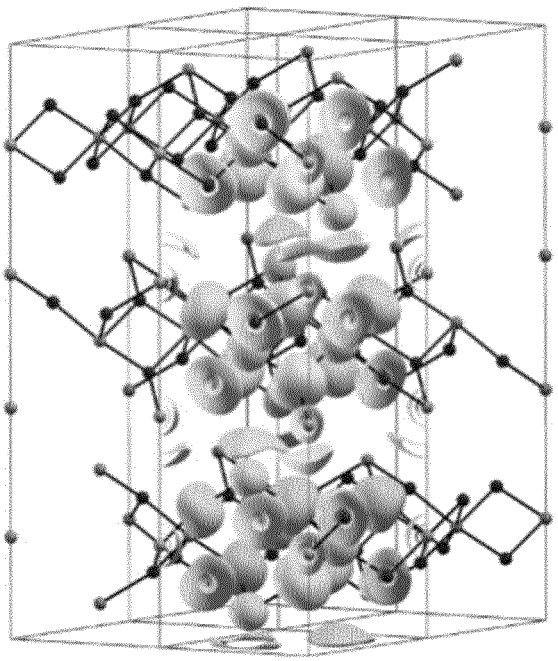

FIG. 5a displays the simulated electron localization function (isosurface at 0.85) of the O valence electrons in the $SnTiO_3$ material of the present invention. FIG. 5b displays the simulated electron localization function (isosurface at 0.6) of $SnTiO_3$ showing the structure directing lone pair of $Sn^{2+}$ between the layers.

Figure 6:
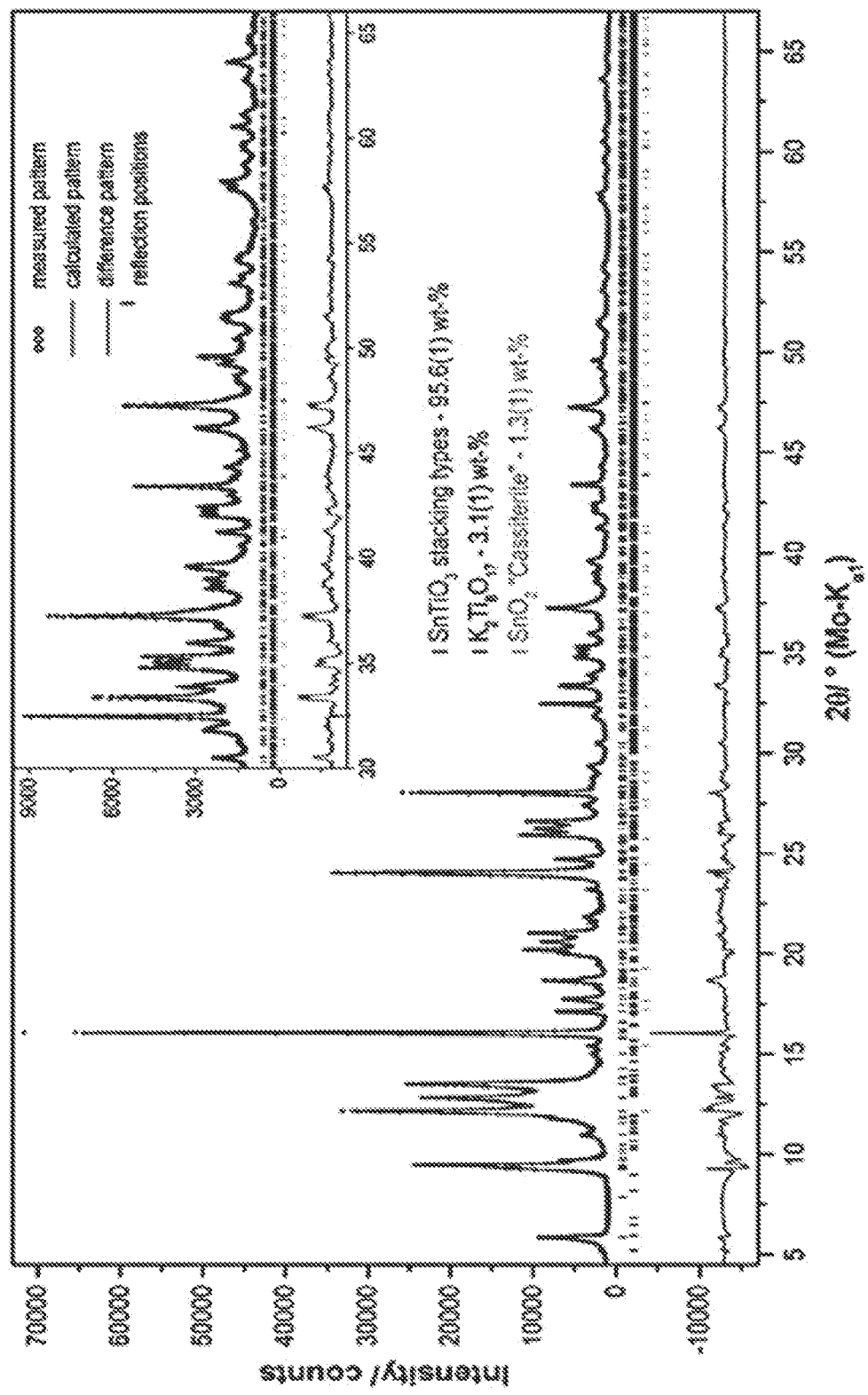

FIG. 6 shows the final Rietveld-refinement of the crystal structure of $SnTiO_3$ according to the present invention employing different polytypes in order to represent coherently scattering domains that exhibit different stacking orders. The region above 30° 2θ is enlarged for clarity (insert).

Figure 7:
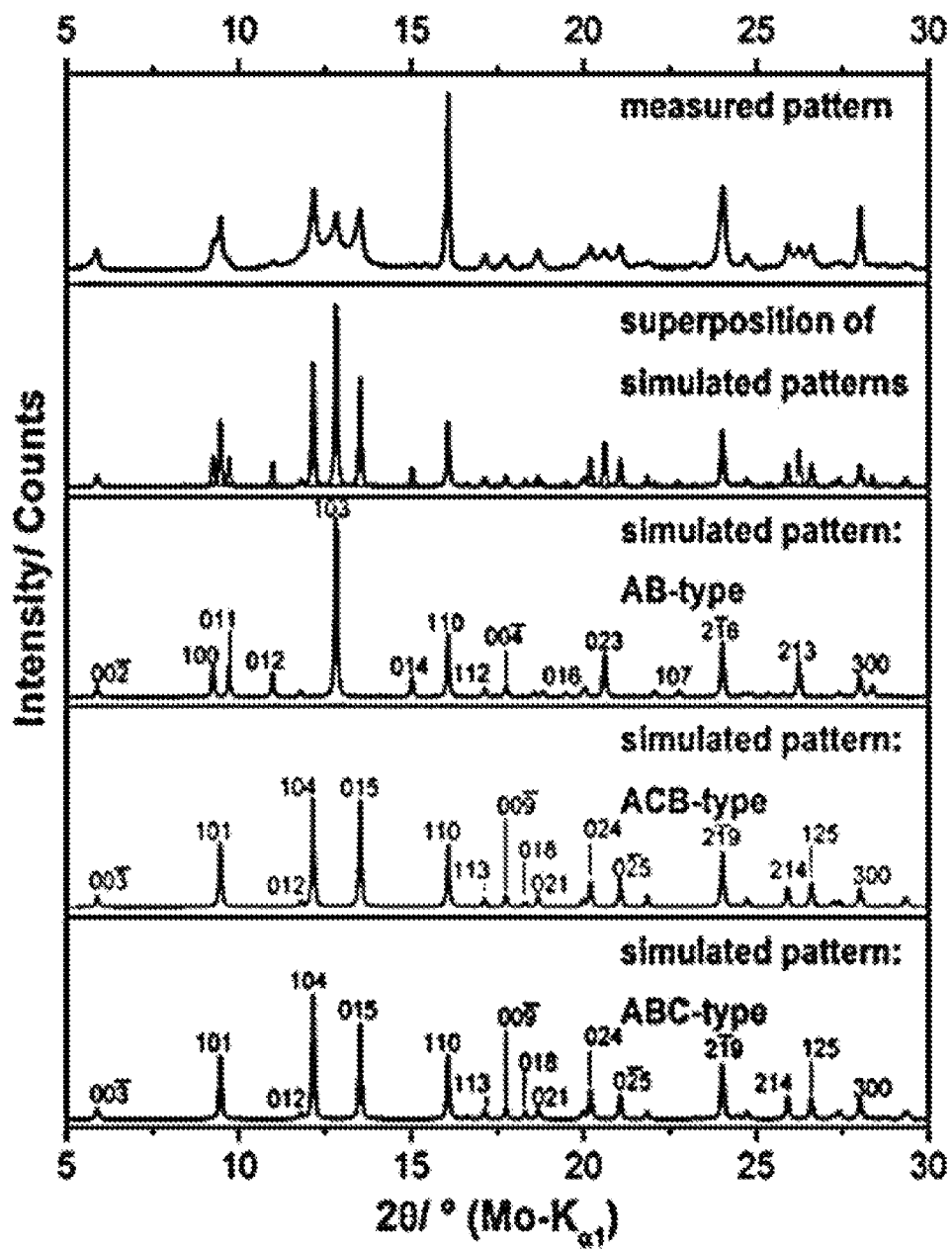

FIG. 7 compares simulated X-ray powder diffraction patterns of stacking orders of $SnTiO_3$ with the measured X-ray powder diffraction pattern of the material of the present invention.

Figure 8:
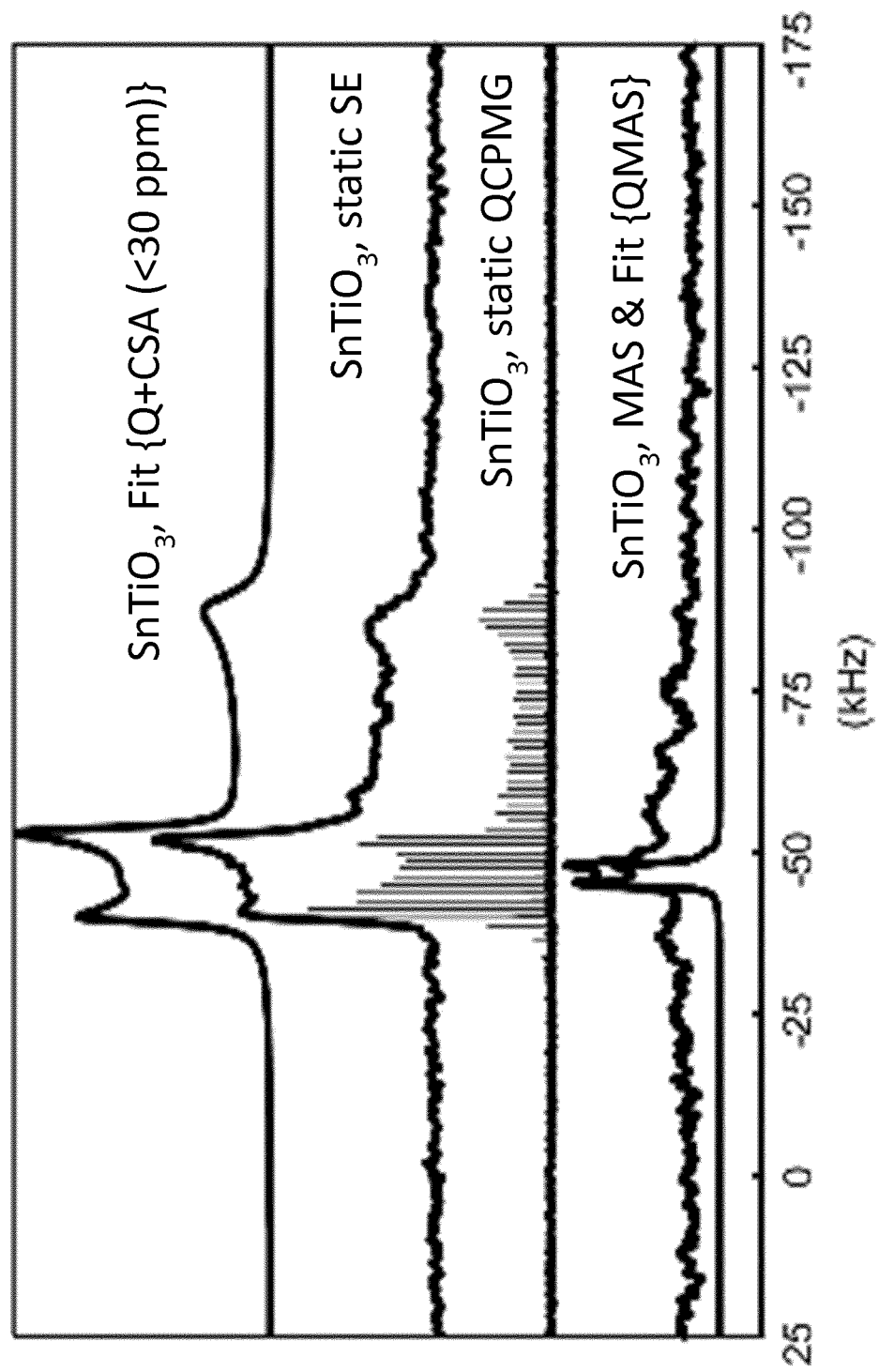

FIG. 8 displays a 21.1 T high field solid state nuclear magnetic resonance spectra of $^{47,49}Ti$ under static solid-echo and quadrupolar Carr-Purcell-Meiboom-Gill (QCPMG) conditions with corresponding fit, assuming two central transitions with $2^{nd}$ order quadrupolar interactions.

Figure 9:
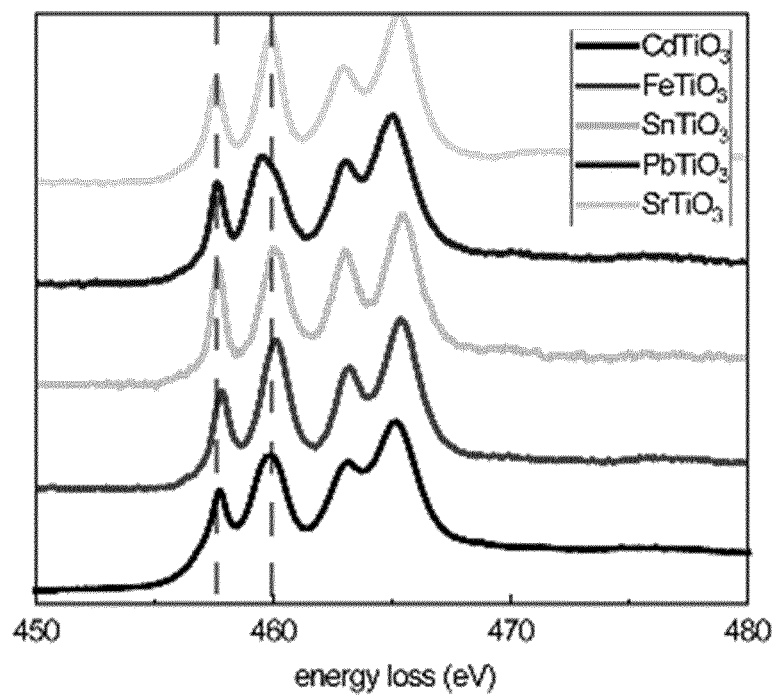

FIG. 9 displays electron energy loss spectra of the Ti $L_{2,3}$ edge of the following titanates, from bottom to top: $CdTiO_3$, $FeTiO_3$, $SnTiO_3$, $PbTiO_3$, and $SrTiO_3$.

Figure 10:
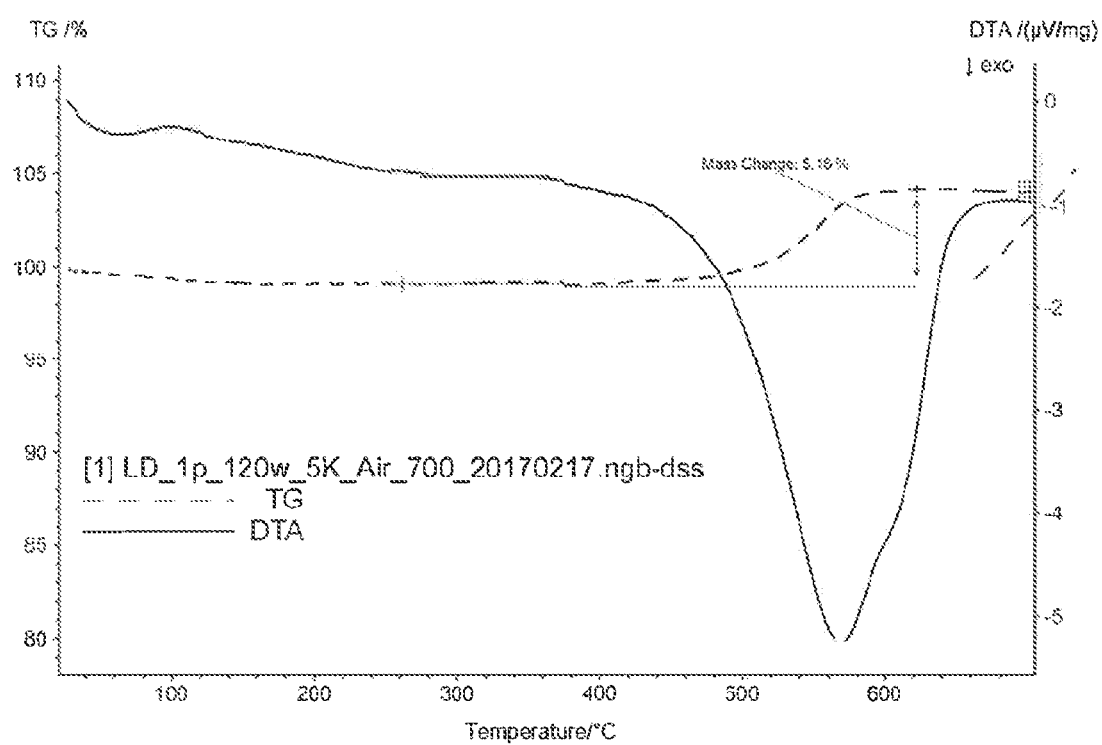

FIG. 10 displays a thermal gravimetric analysis measurement of a $SnTiO_3$ material of the present invention in air showing a weight increase of about 5 mass % starting at a temperature of about 350° C.

Figure 11:
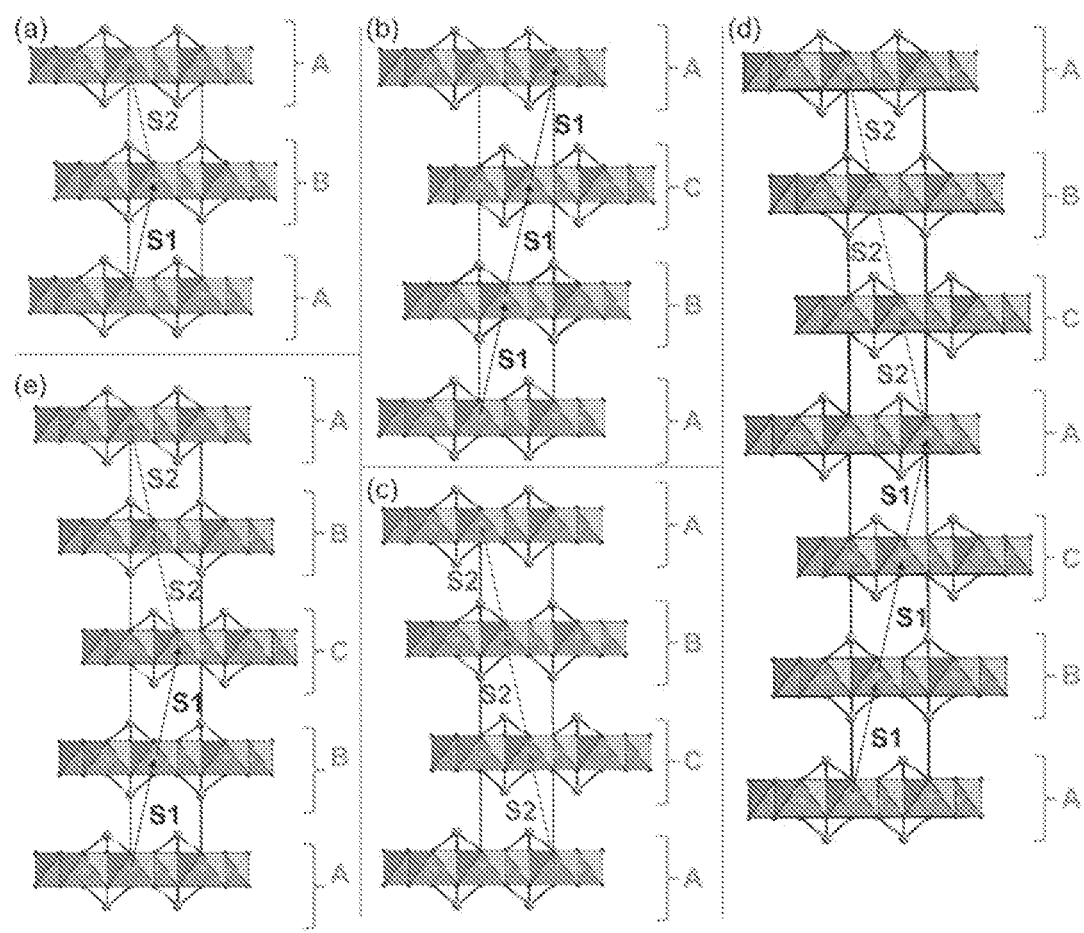

FIG. 11 illustrates hypothetical stacking orders in the crystal structure of $SnTiO_3$ with the basic stacking types AB (a), ABC (b), ACB (c) and twinning with different ranges: ABCACB (d) and ABCB (e).

Figure 12:
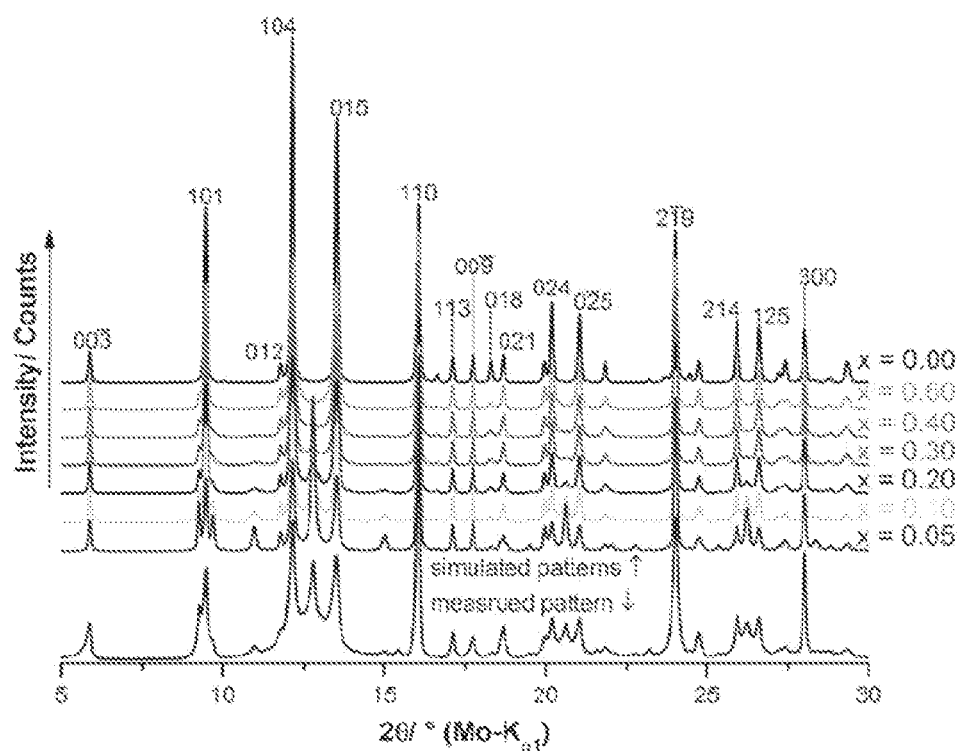

FIG. 12 is a comparison of simulated X-ray powder diffraction patterns of stacking faulted $SnTiO_3$ that exhibits crystallographic intergrowth of ABC-/ACB-stacked sections with AB-type stacked sections with the measured pattern of the material of the present invention. For the simulations, the extension of the ABC-/ACB-stacked domains was kept constant and the extension of the AB-type stacked sections was gradually increased. The probability for a "change" from ABC-type to ABC-type is 0.95 (meaning remaining in the same stacking type) and the probability for change from AB-type to ABC/ACB-type is described by the parameter x.

Figure 13:
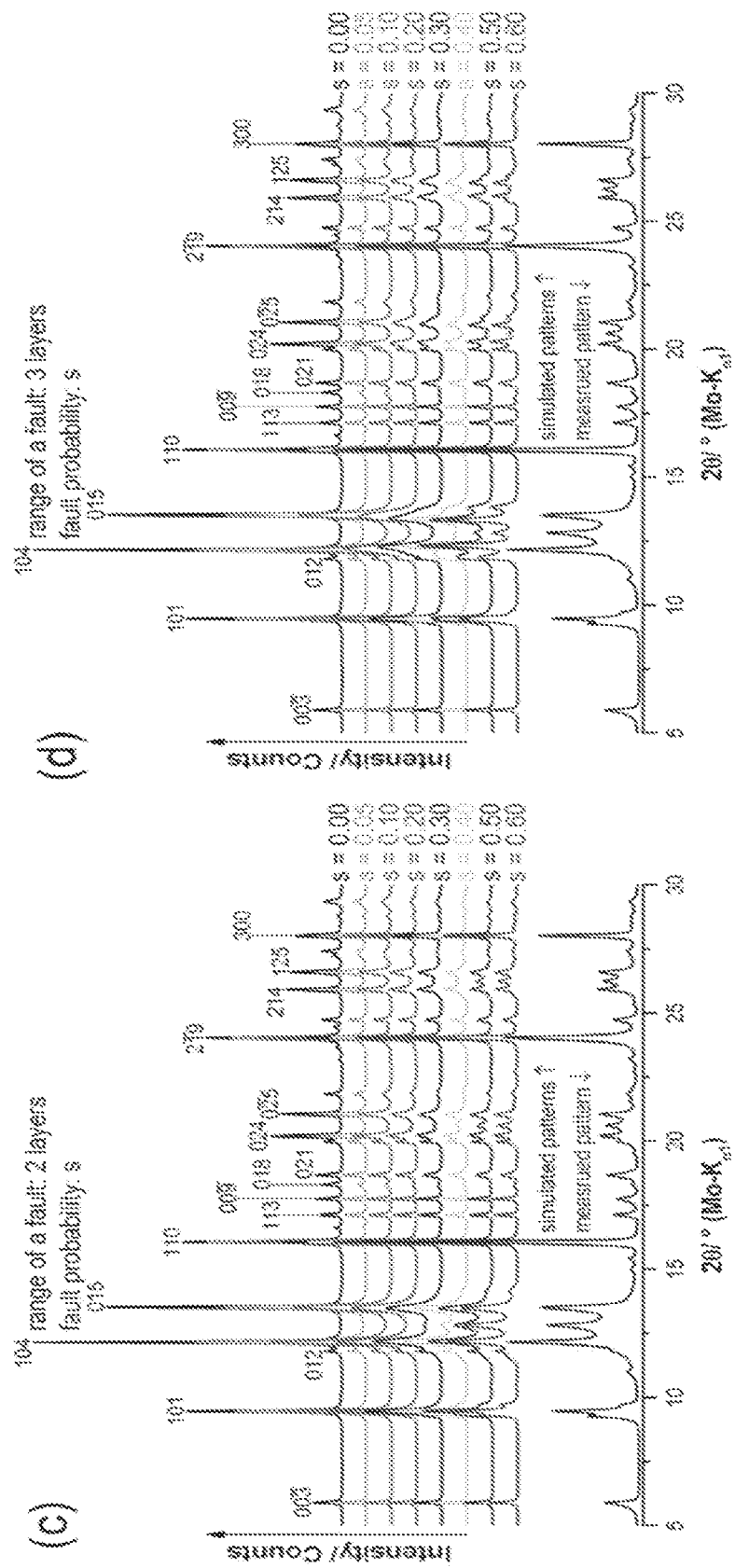

FIG. 13 is a comparison of simulated X-ray powder diffraction patterns of stacking faulted $SnTiO_3$ that exhibits 120° twinning along the c-axis with the measured pattern of the material of the present invention. For the simulations, the fault probability s was gradually increased for different ranges respectively. Ranges of 0 (a), 1 (b), 2 (c) and 3 (d) layers were applied. In other words, bigger ranges of twinning induce bigger coherently scattering domains.

Figure 14:
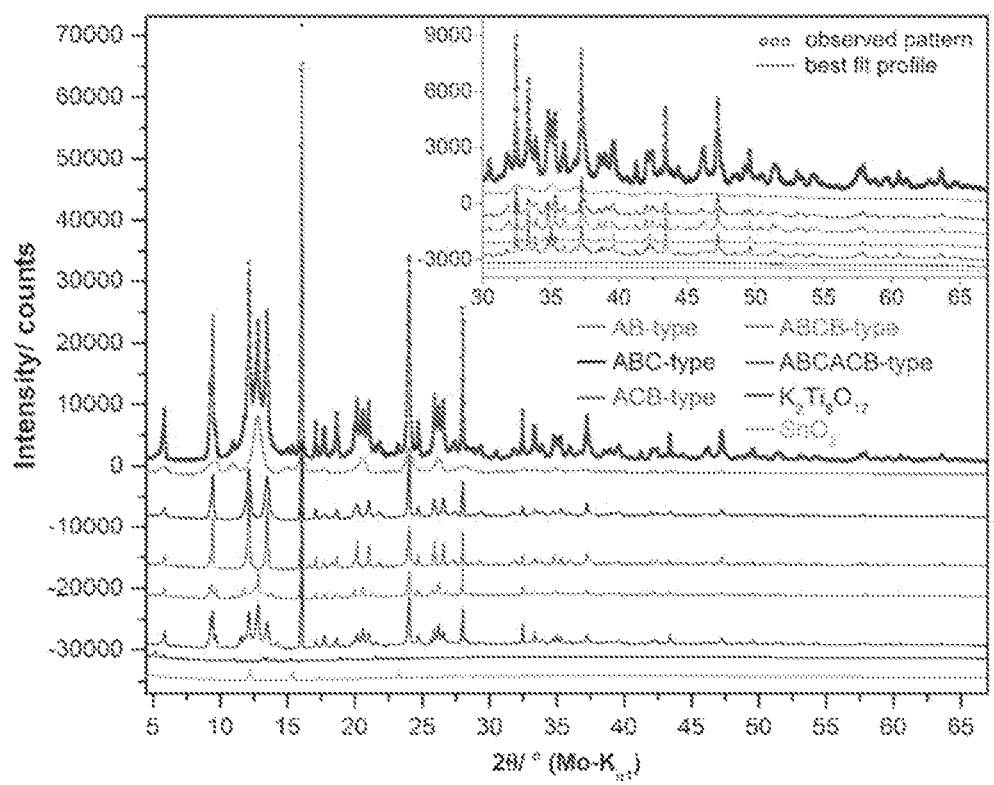

FIG. 14 shows the final Rietveld-refinement of the measured X-ray powder diffraction pattern of the material of the present invention by using a multiphase approach that includes five polytypes of $SnTiO_3$ representing the different basic stacking types and twinning domains (see FIG. 11, with all having an identical layer constitution. $SnO_2$ and $K_2Ti_8O_{17}$ were included as impurity phases, as well. The section starting at 30° 2θ is enlarged for clarity (insert).

The calculated pattern is decomposed into the contributions of each phase. From top to bottom: Refined pattern and the superimposed calculated pattern, AB-type, ABC-type, ACB-type, ABCB-type, ABCACB-type, $K_2Ti_8O_{17}$ and $SnO_2$.

Figure 15:
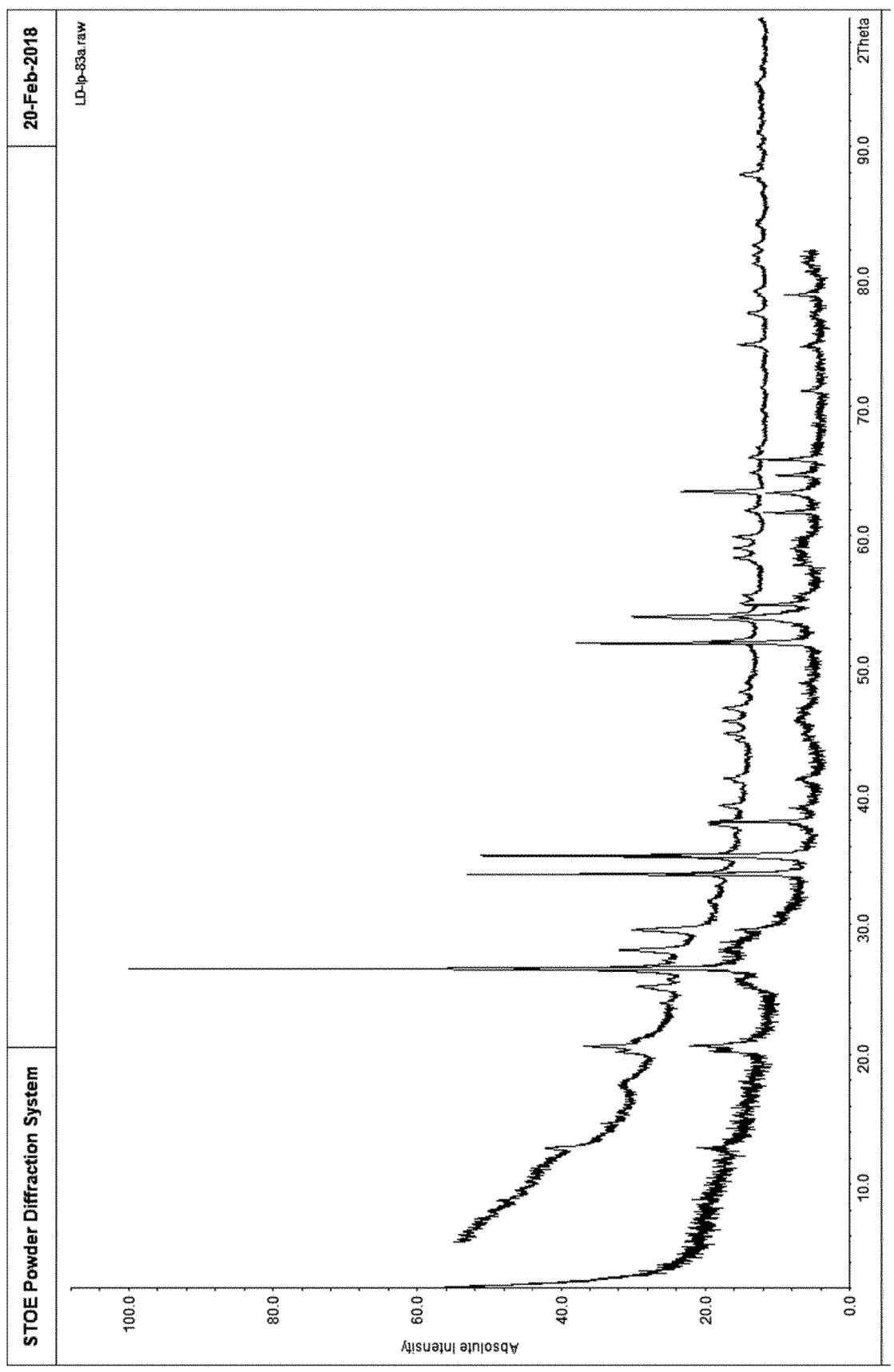

FIG. 15 shows a measured X-ray powder diffraction pattern of $SnTiO_3$ materials prepared from (i) $K_2Ti_2O_5$ (upper pattern) and (ii) prepared from $Li_2TiO_3$ (lower pattern), reflections at 26.6° 2θ, 33.9° 2θ and 51.8° 2θ can be assigned to a $SnO_2$ side phase.

Figure 16:
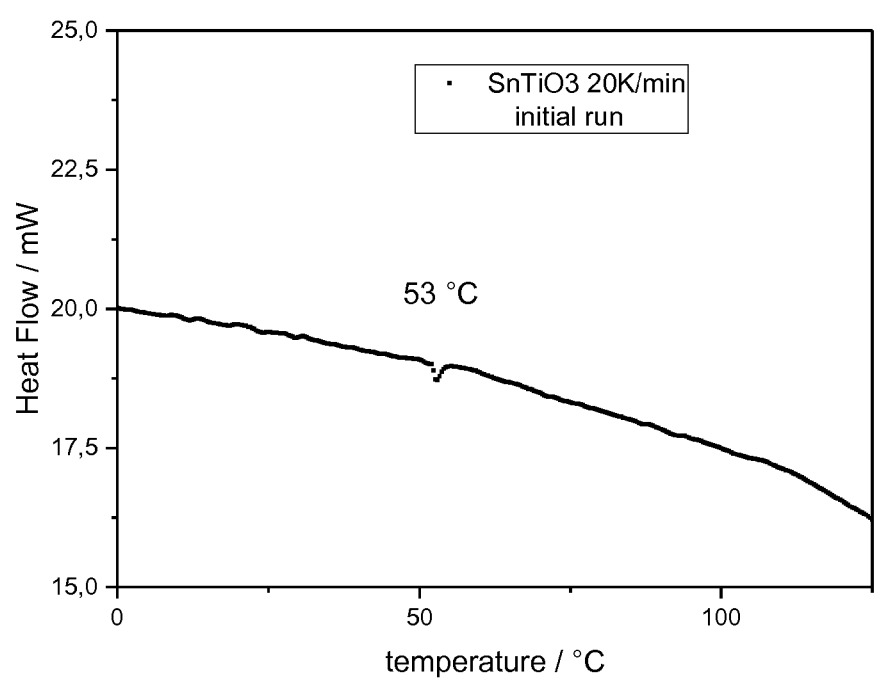

FIG. 16 shows a differential scanning calorimetry measurement of $SnTiO_3$ indicating a phase transition of the $SnTiO_3$ during heating in the range from 50 to 80° C.

Figure 17:
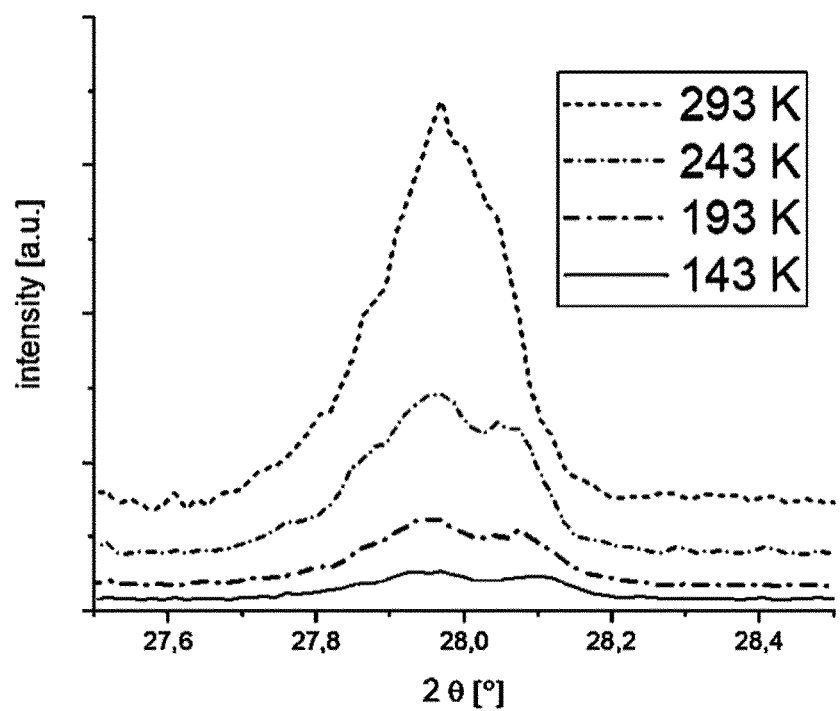

FIG. 17 displays temperature dependent X-ray powder diffraction pattern of $SnTiO_3$ materials cooled from room temperature 20° C. in steps of −50° C. to −120° C. (from top to down) showing peak splitting in all (hk0) reflections (e.g. at ca. 16° 2θ, 24° 2θ or 28° 2θ.

Figure 18:
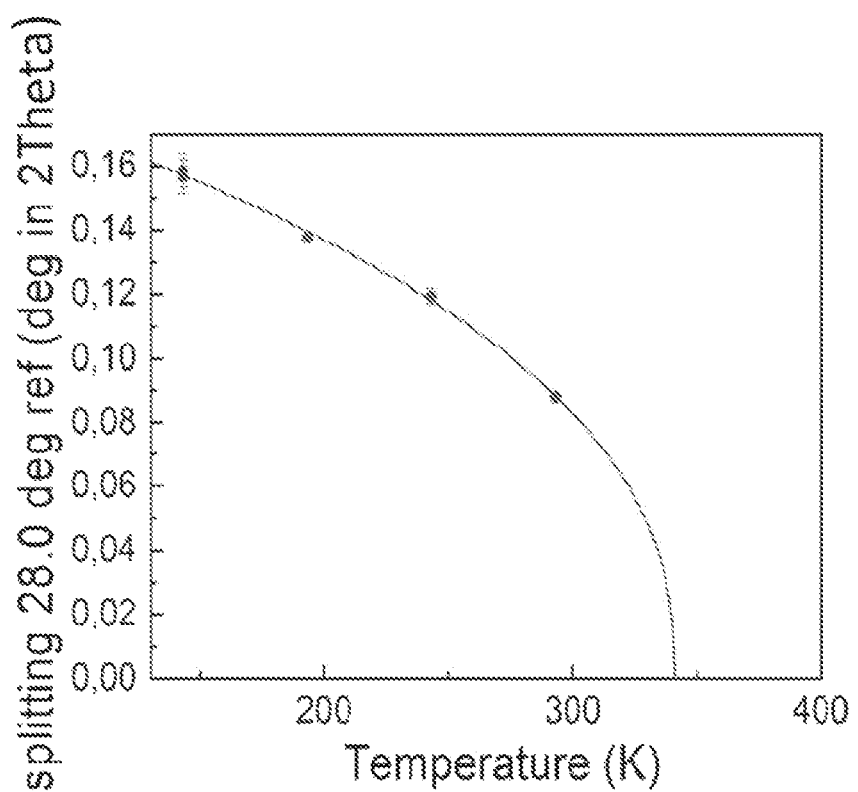

FIG. 18 displays a detailed temperature-dependent X-ray powder diffraction pattern of $SnTiO_3$ materials showing peak splitting of the peak at 28° 2θ with decreasing temperature from 293 K to 143 K indicative of a phase transition.

Figure 19:
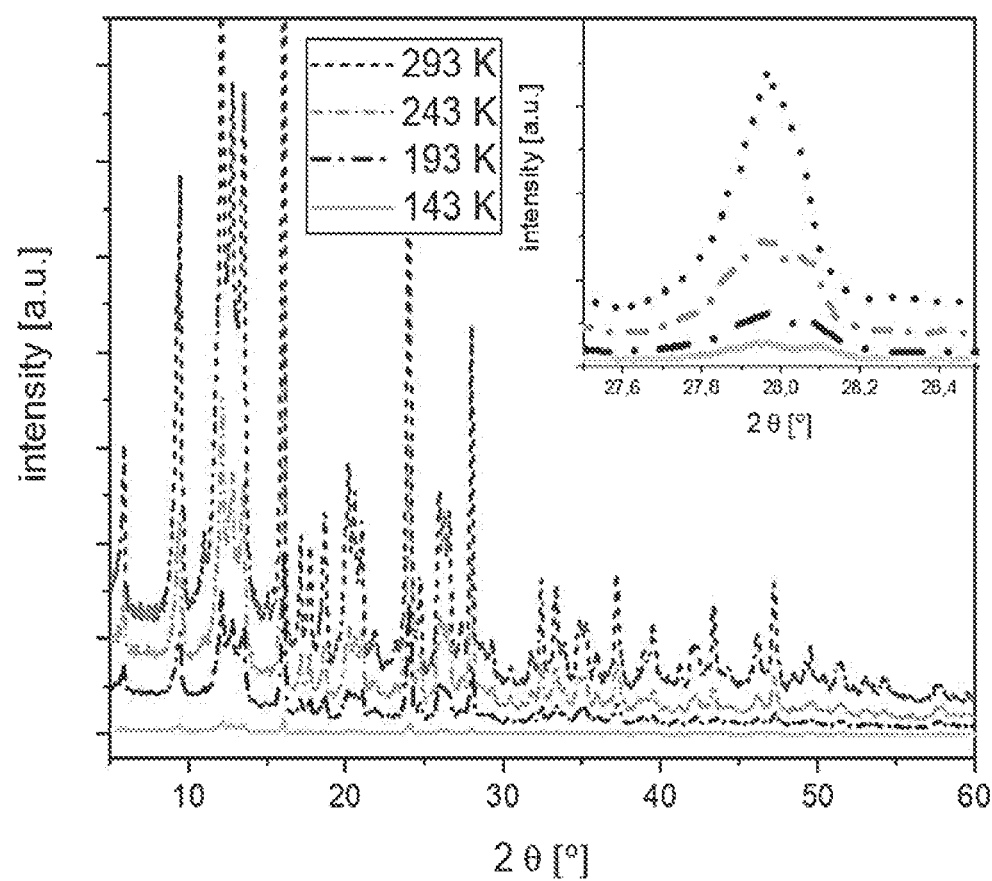

FIG. 19 evaluates the found peak splitting of the peak at 28° 2θ (see inset and FIG. 17) and the fit predicts the phase transition to be around ~340 K.

Figure 20:
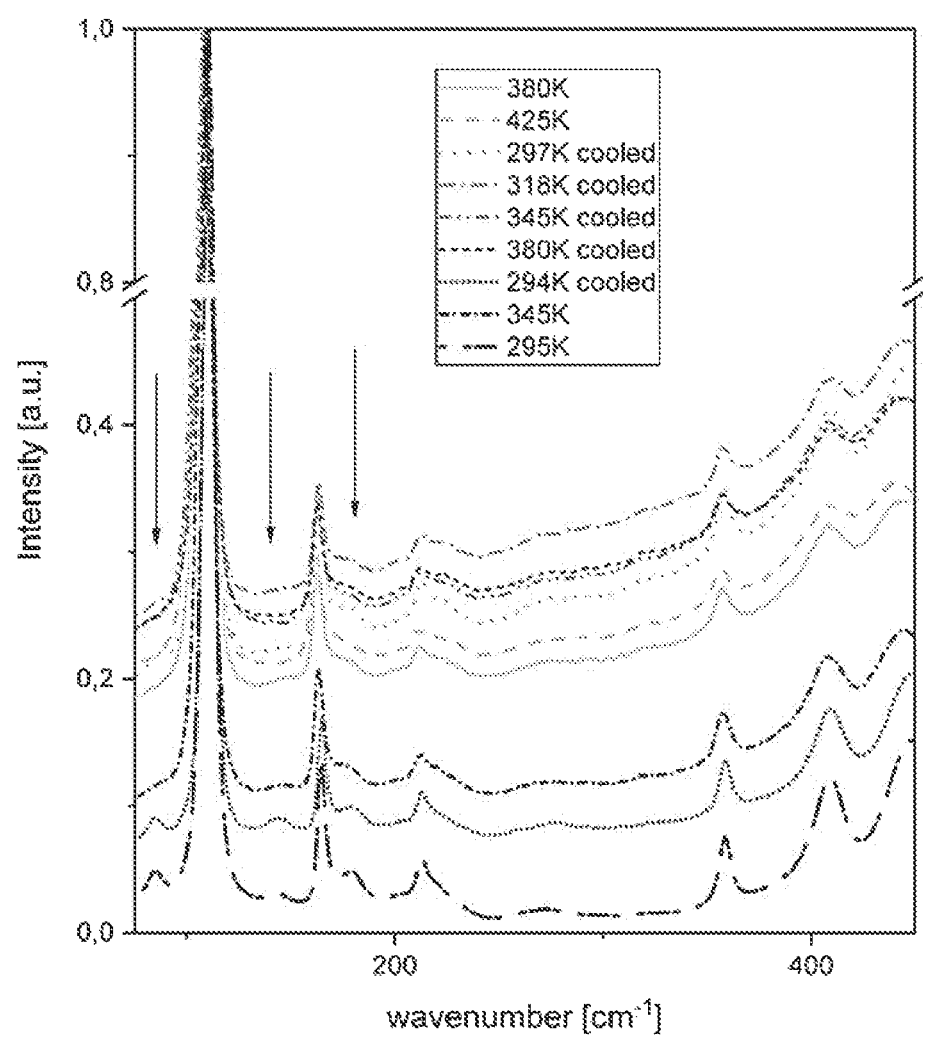

FIG. 20 shows temperature-dependent Raman spectra of $SnTiO_3$ showing the disappearance of Raman bands at temperatures above 80° C. (indicated by arrows), thus, indicating a phase transition around this temperature.

Figure 21:
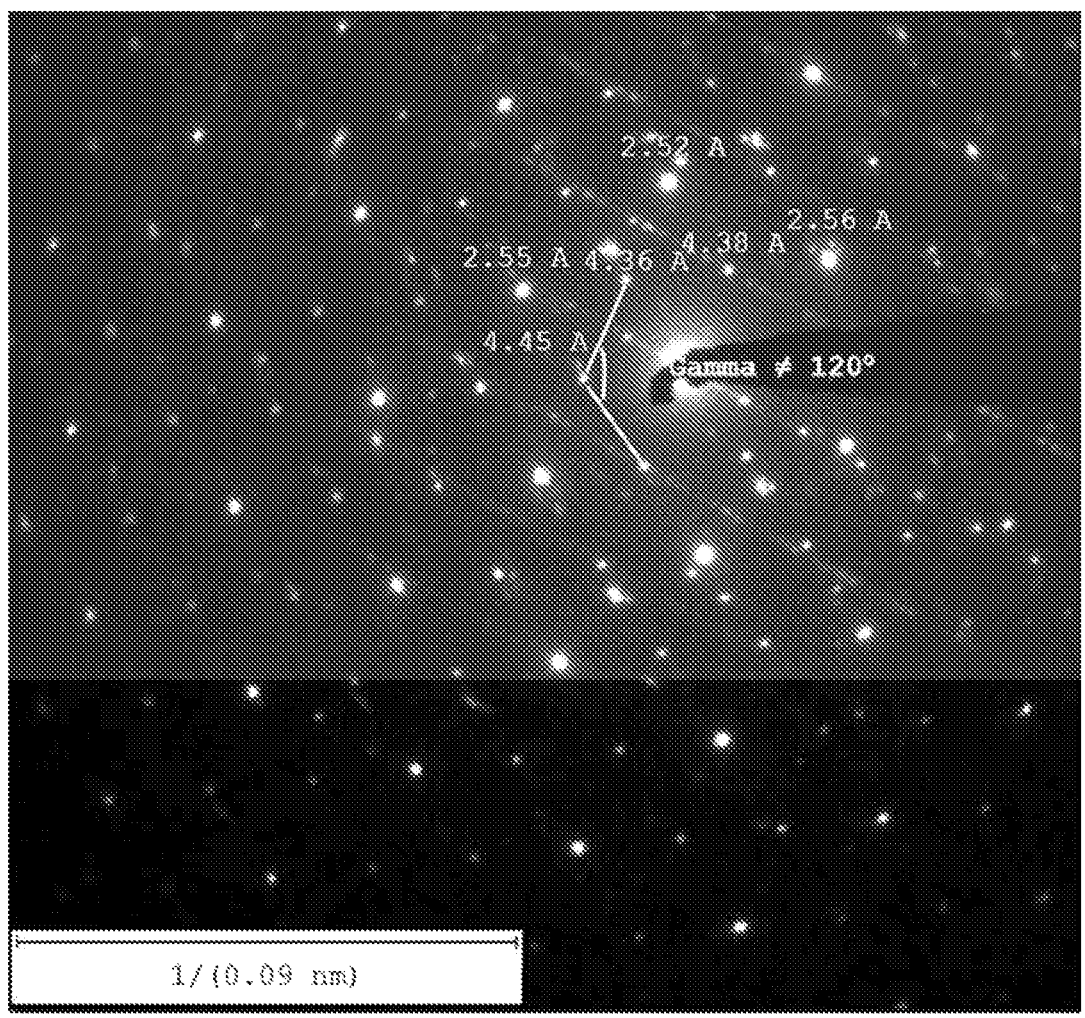

FIG. 21 displays the selected area electron diffraction of an $SnTiO_3$ material according to the first aspect of the present invention indicating an approximately hexagonal crystal structure with distances of 4.45 Å≠4.36 Å and γ=119.2°.

Figure 22:
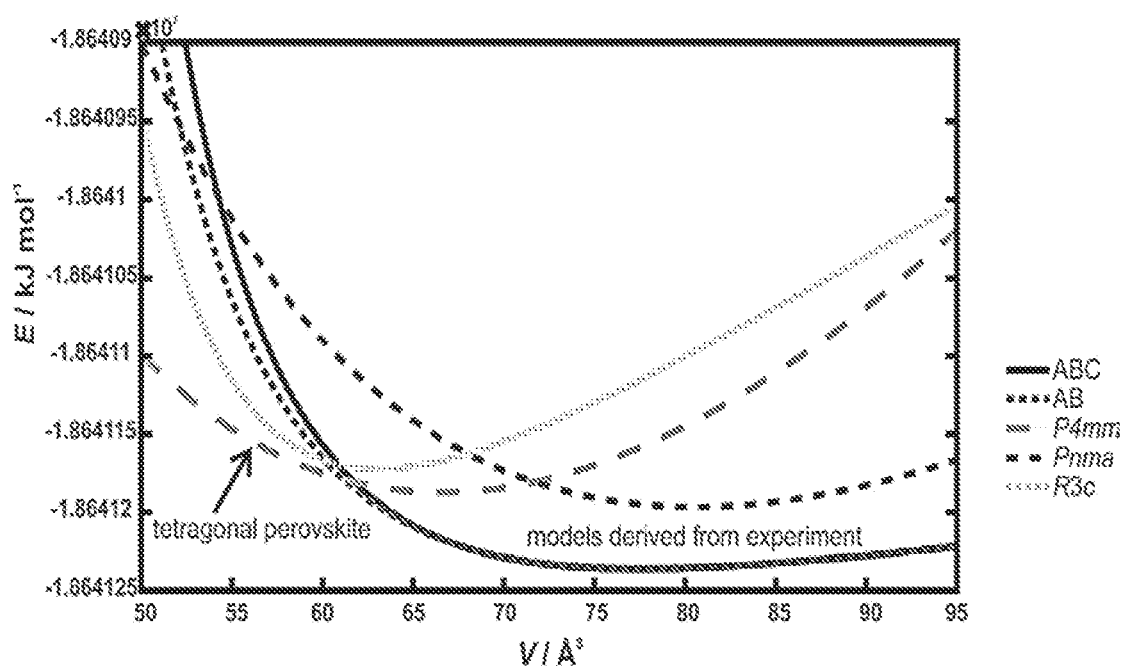

FIG. 22 shows the DFT-calculated energy vs volume curves of 19 different structure models applied to $SnTiO_3$, whereas the experimentally observed structure model is energetically favored.

Figure 23:
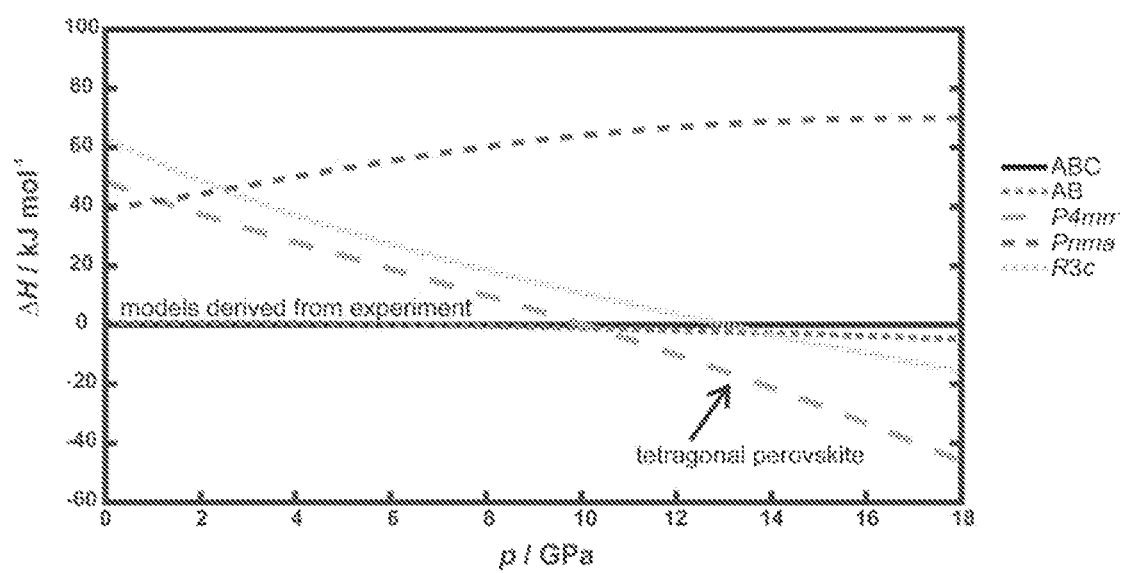

FIG. 23 shows the DFT-calculated enthalpy vs pressure diagrams of all 19 modeled structure types. A phase transition from ilmenite-type derived ABC/AB-stacking polytypes to a tetragonal perovskite structure type at high pressures can be predicted.

Figure 24:
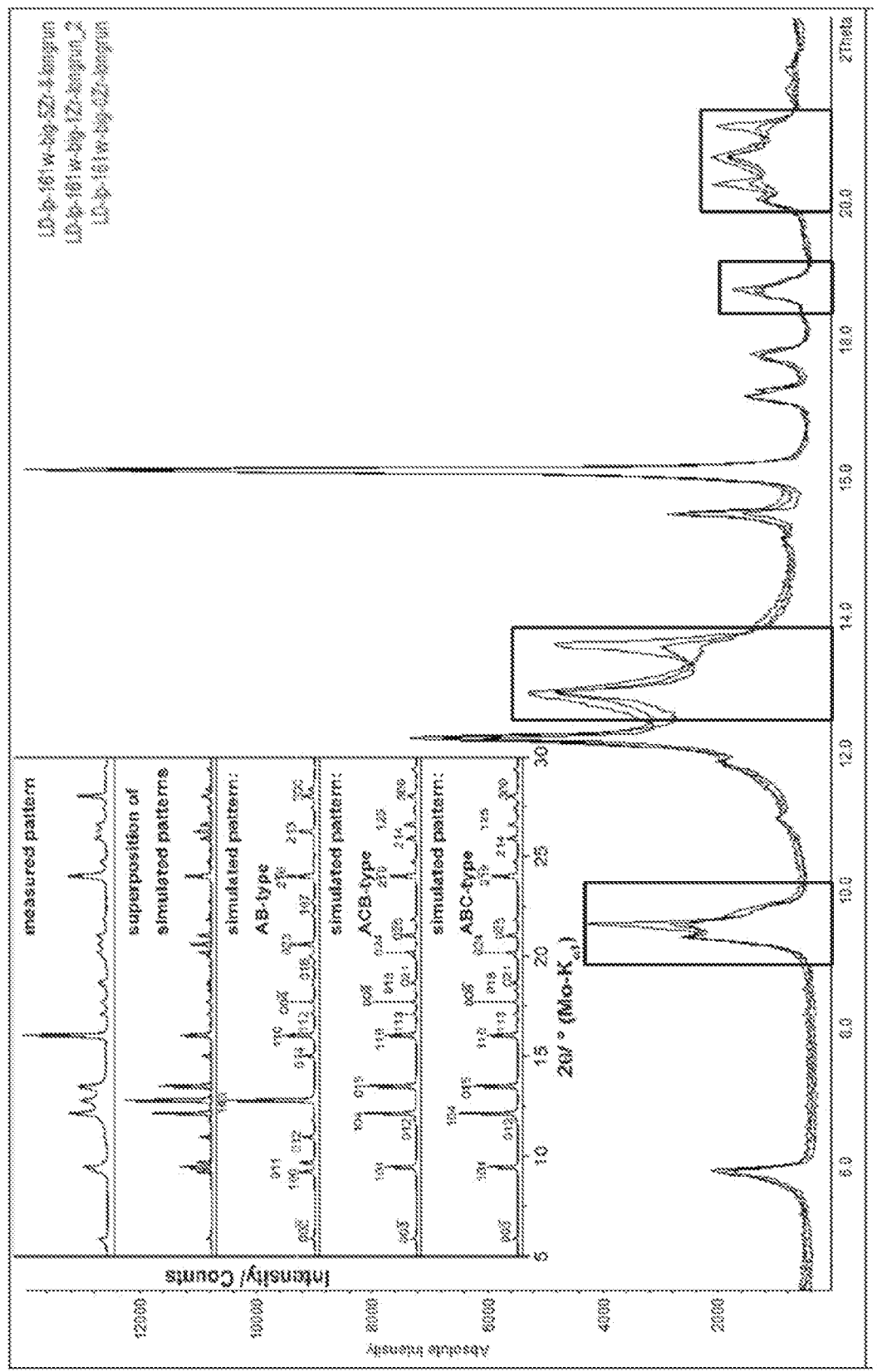

FIG. 24 shows the X-ray powder diffraction pattern of $SnTiO_3$ materials wherein 0, 1 and 5 mol % of the Ti is substituted with Zr, respectively, indicating a decrease of the peak intensities at about 9.5°, 13.5°, 18.7°, 20° and 21° 2θ with increasing Zr content, while at the same time peak intensities at 12.8° and 20.6° are increasing and thus indicating influence on the stacking order (see also FIG. 7).

Figure 25B:
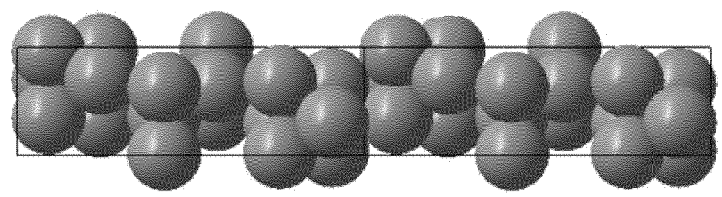
Figure 25A:
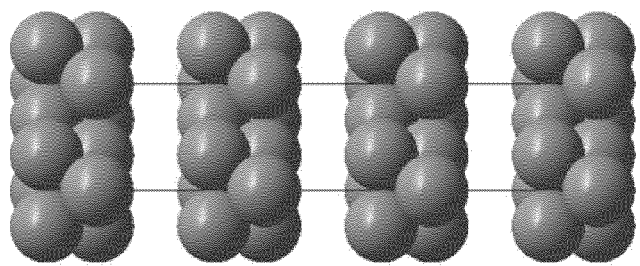

FIG. 25a displays the packing of O ions in the material of the present invention having a layered structure. FIG. 25b shows the packing of O ions in a conventional ilmenite-type structure. It is apparent that in the material of the present invention, the O ions within a layer are close-packed, while the O—O distance between different layers along the c-axis is larger than the O—O distance within the close packing of a layer (FIG. 25a). In contrast, in the ilmenite-type structure, the O ions are also close-packed, more specifically hexagonally close-packed in all three directions (FIG. 25b).

Figure 26:
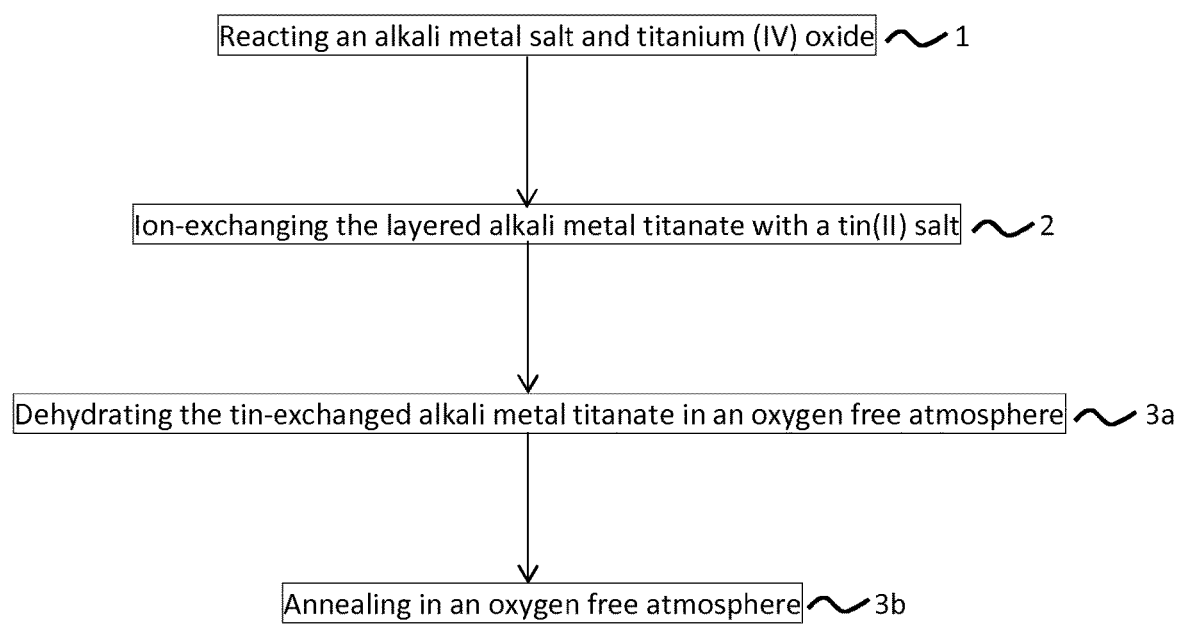

FIG. 26 is a flowchart showing the steps of the method of the present invention and shows the steps of reacting an alkali metal salt and titanium(IV) oxide (1); ion-exchanging the layered alkali metal titanate with a tin (II) salt (2); dehydrating the tin-exchanged alkali metal titanate in an oxygen free atmosphere (3a) and subsequently annealing in an oxygen free atmosphere (3b).

Figure 27:
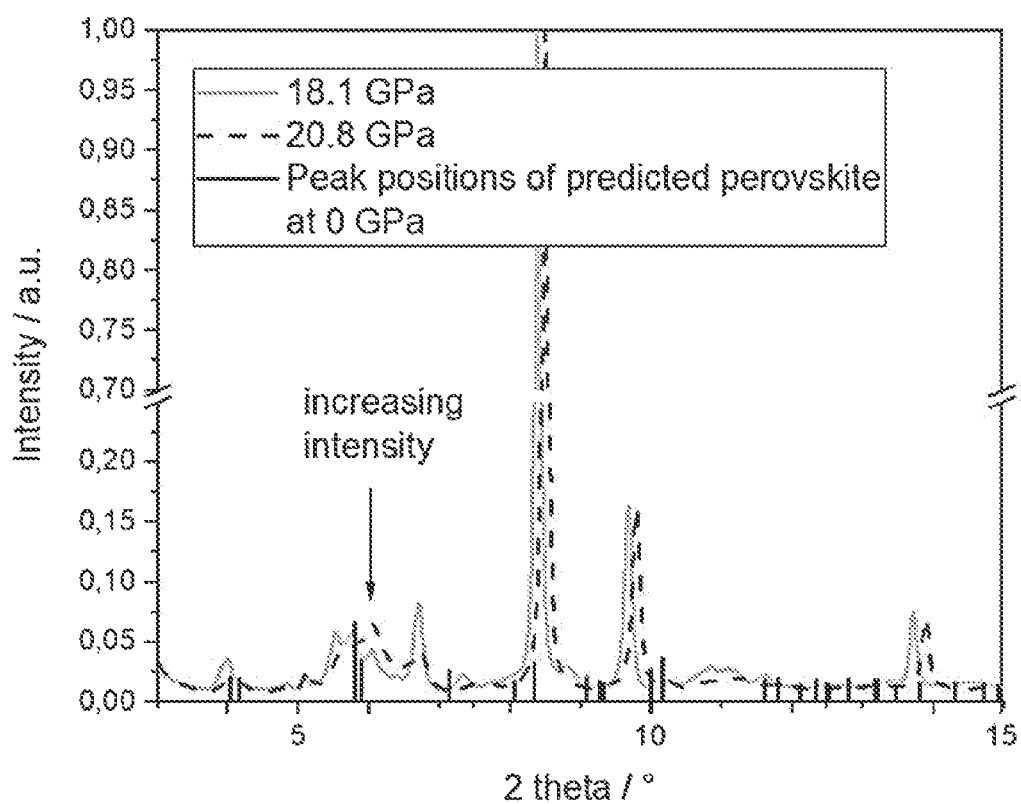

FIG. 27 shows the X-ray powder diffraction patterns of $SnTiO_3$ exposed to a maximum pressure of 18.1 GPa (solid line) and 20.8 GPa (interrupted line), respectively. The high-pressure data have been obtained from synchrotron radiation at 0.28 Å. The measurements have been carried out in a Diamond Anvil Cell using Neon as the pressure medium. The pressure was gradually increased from ambient pressure to the maximum pressure. The reflections at about 8.5°, 9.75° and 13.75° are assigned to crystallized Neon. The marked peak positions in black (vertical lines) show the predicted intensities and peak positions of a tetragonal perovskite at ambient pressure. The X-ray powder diffraction patterns indicate that, at least at 20 GPa, the material transforms into the high pressure modification.

DETAILED DESCRIPTION OF THE INVENTION

Material of the Formula $SnTiO_3$

As mentioned above, a first aspect of the present invention relates to a material of the formula $SnTiO_3$ having a crystal structure comprised of layers,
wherein
the layers comprise Sn(II) ions, Ti(IV) ions and edge-sharing $O_6$-octahedra,
the edge-sharing $O_6$-octahedra form a sub-layer, i.e. a sub-layer within each of the layers,
the Ti(IV) ions are located within two thirds (⅔ or 66.66%) of the edge-sharing $O_6$-octahedra, thus forming edge-sharing $TiO_6$-octahedra,
the edge-sharing $TiO_6$-octahedra form a honeycomb structure within the sub-layer, the honeycomb structure comprising hexagons with Ti(IV)-vacancies within the hexagons,
the Sn(II) ions are located above and below the Ti(IV)-vacancies with respect to the sub-layer,
the Ti(IV) ions are optionally substituted with M, M is one or more elements selected from Group 4 and Group 14 elements, and
the crystal structure satisfies at least one of the following features (i) and (ii):
 (i) the Sn(II) ions have a (distorted) tetrahedral coordination sphere involving three O ions of the layer and the electron lone pair of the Sn(II) ions which is situated at an apical position relative to the three O ions of the layer,
 (ii) the layers are stacked so that each layer is translated relative to each adjacent layer by a stacking vector S1 or a stacking vector S2,
 the centers of adjacent hexagons form a parallelogram with a side having a length x and side having a length y, the stacking vector S1 is a combined translation along the side having the length x by ⅔ x and along the side having a length y by ⅓ y,
 the stacking vector S2 is a combined translation along the side having the length x by ⅓ x and along the side having a length y by ⅔ y,
 and the crystal structure comprises layers translated relative to adjacent layers by the stacking vector S1 and layers translated relative to adjacent layers by the stacking vector S2.

Generally, the crystal structure of the materials of the present invention can be determined by X-ray powder diffraction (XRPD). More particularly, a Stoe STADI P diffractometer ($Mo_{K\alpha 1}$ radiation, Ge(111) monochromator, Mythen detector) was used for powder diffraction measurements in Debye-Scherrer geometry and TOPAS 6.0 was used for structure refinement. For details, please refer to the section entitled "X-ray powder diffraction (XRPD)".

Symmetry

The crystal structure of the material according to the first aspect of the present invention has preferably a trigonal symmetry. The material according to the first aspect of the present invention may also have a non-centrosymmetric symmetry.

The a-b plane is a plane parallel to the layers and the sub-layers of the crystal structure of the material according to the first aspect of the present invention. The c-axis is an axis perpendicular to this plane.

Honeycomb Structure

Figure 3A:
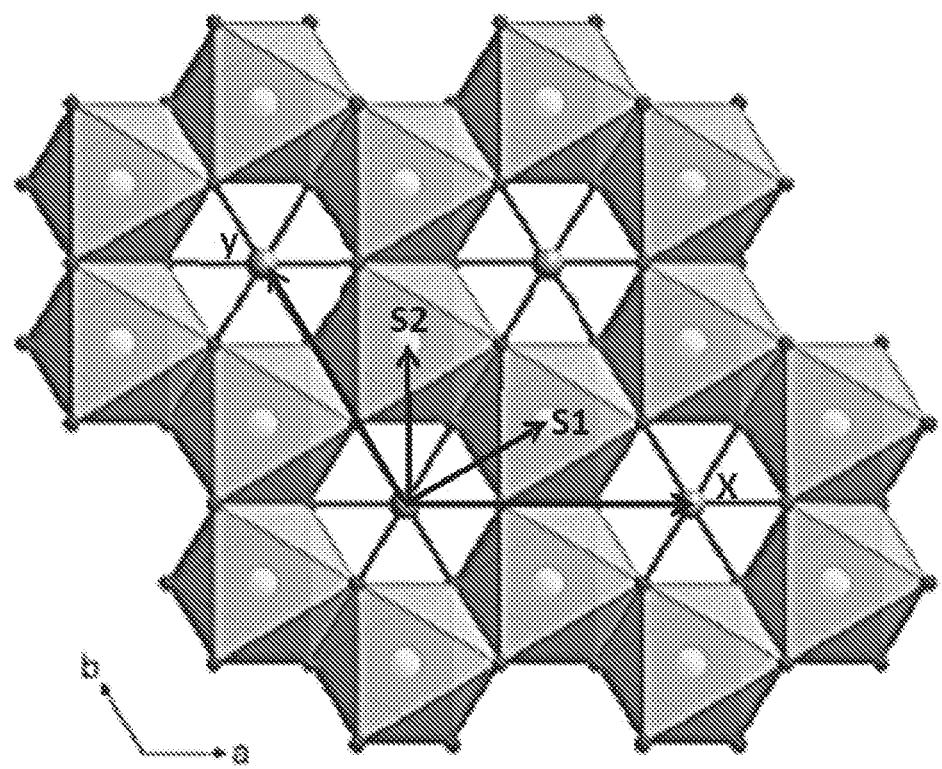

In the material of the formula $SnTiO_3$ according to the first aspect of the present invention, the crystal structure is comprised of layers, wherein the layers comprise Sn(II) ions, Ti(IV) ions and edge-sharing $O_6$-octahedra (see FIG. 3a). In the following, the structure of such a layer is described in detail.

Figure 3B:
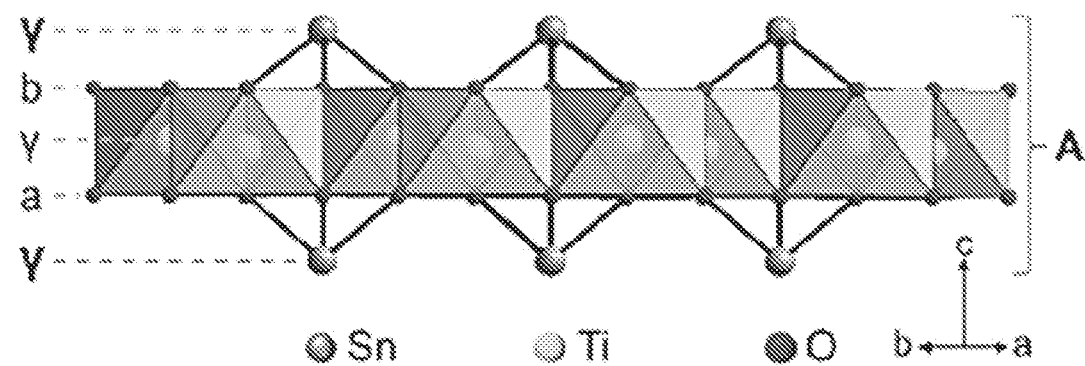
FIG. 3b is a packing diagram illustrating a layer in the layered crystal structure of the material of the present invention along an axis parallel to the layer and showing a sub-layer formed of $O_6$-octahedra, and Sn(II) ions above and below the sub-layer.

Each of the edge-sharing $O_6$-octahedra is formed by an octahedral arrangement of 6 $O^{2-}$ anions, which are in the following referred to as O ions. As shown in FIG. 3b, the edge-sharing $O_6$-octahedra form a sub-layer within the layer. The sub-layer forms part of the layer which comprise Sn(II) ions, Ti(IV) ions and edge-sharing $O_6$-octahedra and is a layer by itself. The edge-sharing $O_6$-octahedra are preferably arranged in the sub-layer such that the centers of the $O_6$-octahedra lie in a plane. The centers are the geometrical centers of the edge-sharing $O_6$-octahedra. The plane parallel to the sub-layer is designated as a-b plane and the axis perpendicular to this plane is designated as c-axis.

As shown in FIG. 25a, the O ions of the edge-sharing $O_6$-octahedra within the sub-layer of the material according to the first aspect of the present invention are close-packed. The sub-layer comprises two atomic layers of close-packed O ions. The O ions of the sub-layer do not form a close packing with O ions of adjacent layers. In particular, the O ions of the sub-layer do not form a hexagonal close packing with O ions of adjacent layers. Hence, the distance between O ions of different layers along the c-direction is larger compared to the distance of O ions within a layer. In contrast, in an ilmenite-type structure, the O ions are close-packed, specifically hexagonal close-packed, in all three directions (FIG. 25b).

The Ti(IV) ions are located within two thirds (⅔ or 66.66%) of the edge-sharing $O_6$-octahedra, thus forming edge-sharing $TiO_6$-octahedra (see FIGS. 3 and 4b). The edge-sharing $TiO_6$-octahedra form a honeycomb structure within the sub-layer, and, thus parallel to the a-b plane, as illustrated in FIG. 3a. Referring to FIG. 3a, a honeycomb structure is defined herein as a structure composed of edge-sharing $TiO_6$-octahedra, wherein the edge-sharing $TiO_6$-octahedra in the layer form hexagons when viewed along the c-axis, so that each edge-sharing $TiO_6$-octahedron forms part of three hexagons of the layer. In other words, each $O_6$-octahedron in the sub-layer which is not occupied by a Ti(IV) ion is surrounded by six $TiO_6$-octahedra. In the following, the centers of $O_6$-octahedra which are not occupied by Ti(IV) ions are denoted as Ti(IV)-vacancies. The Ti(IV) ions also form a honeycomb structure parallel to the a-b plane. Thus, the Ti(IV)-vacancies in the edge-sharing $O_6$-octahedra are surrounded by six Ti(IV) ions in adjacent edge-sharing $O_6$-octahedra in the a-b plane.

The edge-sharing $TiO_6$-octahedra may be distorted. For example, the edge-sharing $TiO_6$-octahedra may be distorted trigonally. The trigonal distortion is a distortion along three-fold axis of the $TiO_6$-octahedra, wherein all $TiO_6$-octahedra within the layer are distorted along parallel three-fold axis in the same direction.

Position of Ti(IV)

The Ti(IV) ions are located within two thirds (⅔ or 66.66%) of the edge-sharing $O_6$-octahedra, preferably in the center of the edge-sharing $O_6$-octahedra, thus forming edge-sharing $TiO_6$-octahedra (see FIG. 4b). The centers are the geometrical centers of the edge-sharing $O_6$-octahedra.

The Ti(IV) ions may exhibit an ideal octahedral coordination sphere or a distorted octahedral coordination sphere.

For example, the Ti(IV) ions may exhibit a trigonally distorted octahedral coordination sphere. The trigonally distorted octahedral coordination sphere is derived from the above described trigonal distortion of the $TiO_6$-octahedra.

The Ti(IV) ions may be substituted with M, wherein M is one or more elements selected from Group 4 and Group 14 elements. Group 4 according to the IUPAC nomenclature is a group of elements in the periodic table containing the elements titanium (Ti), zirconium (Zr), and hafnium (Hf). Group 14 according to the IUPAC nomenclature is a group of elements in the periodic table consisting of carbon (C), silicon (Si), germanium (Ge), tin (Sn), and lead (Pb).

Up to 25 mol %, preferably up to 10 mol %, and most preferably up to 5 mol % of the titanium may be substituted with M. M is preferably one or more elements selected from the group of Si, Ge, Zr and Hf, and is more preferably one or more elements selected from the group consisting of Zr and Hf. Hence, the material according to the first aspect of the present invention may have the formula $SnTi_{1-x}M_xO_3$ with x being in the range of 0 or more and 0.25 or less. Generally, the substitution of Ti(IV) may induce a distortion of the $TiO_6$-octahedra. Thus, the distortion of the $TiO_6$-octahedra and the stacking polytypes can be adjusted by the degree of substitution of Ti, in particular when Ti is substituted with one or both of Zr and Hf. Hence, the substitution of the Ti position with M has an impact on the stacking order of the material of the present invention.

Ti(IV)-Vacancies

As mentioned above, the Ti(IV) ions are located within ⅔ of the edge-sharing $O_6$-octahedra of the sub-layer, thus forming edge-sharing $TiO_6$-octahedra. The remaining ⅓ of the edge-sharing $O_6$-octahedra is not occupied by Ti(IV) ions. The $O_6$-octahedra in the sub-layer which are not occupied by Ti(IV) ions are surrounded by six edge-sharing $TiO_6$-octahedra. The spaces in the $O_6$-octahedra which are not occupied by Ti(IV) ions are denoted as Ti(IV)-vacancies. Thus, the Ti(IV)-vacancies are located within the hexagons of the honeycomb structure formed by the edge-sharing $TiO_6$-octahedra. The Ti(IV)-vacancies are preferably located in the center (in the sense of the geometric center) of the $O_6$-octahedra which are not occupied by Ti(IV). Thus, the Ti(IV)-vacancies are preferably located in the center of the hexagons of the honeycomb structure when viewed along an axis perpendicular to the layer (c-axis). Furthermore, these Ti(IV)-vacancies are preferably arranged in the plane formed by the centers of the edge-sharing $O_6$-octahedra of the sub-layer (a-b plane).

Position of Sn(II)

The Sn(II) ions are located above and below the Ti(IV)-vacancies with respect to the sub-layer within the hexagons along an axis perpendicular to the sub-layer (c-axis). The Sn(II) ions are preferably located in the centers of the hexagons of the honeycomb structure along an axis perpendicular to the sub-layer (c-axis) and are arranged above and below the sub-layer.

Figure 2:
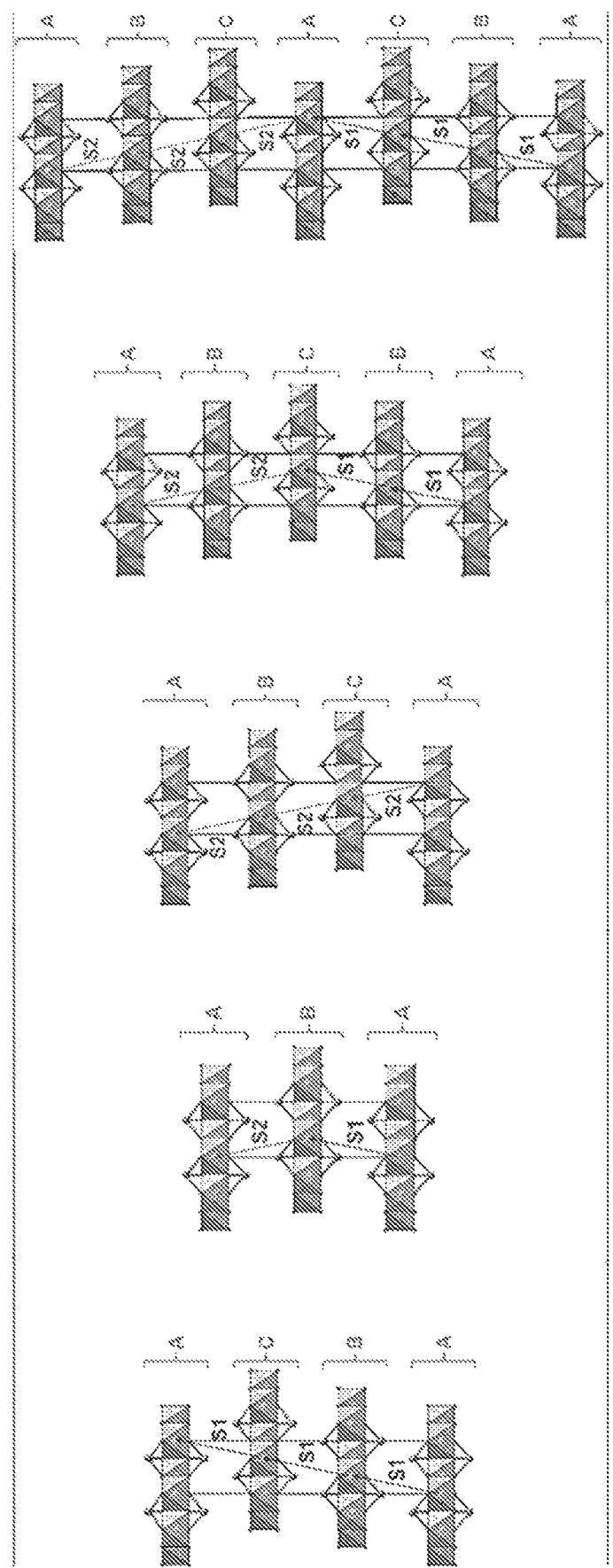
FIG. 2 illustrates five polytypes of $SnTiO_3$ representing distinct stacking orders of the material according to the present invention at ambient conditions.

As illustrated in FIG. 4a, the Sn(II) ions have a trigonal pyramidal coordination sphere involving three O ions of the layer with the Sn(II) ions at the apical position, and the distance of the Sn(II) ions to the closest O ion of an adjacent layer exceeds the distance of the Sn(II) ions to each of the three O ions in their trigonal pyramidal coordination sphere by a factor of 1.5 or more. The coordination sphere of the Sn(II) ions is illustrated in FIG. 2. The apical position is the position at the apex of the pyramid formed by the three O ions and the Sn atoms, wherein the base of the pyramid is formed by the three O ions.

FIG. 4a shows that the coordination sphere of the Sn(II) ions can alternatively be described as a tetrahedral coordination sphere involving three O ions of the layer and the electron lone pairs of the Sn(II) ions which are situated at an apical position relative to a plane formed by the three O ions of the layer. Hence, when the coordination sphere of the Sn(II) ions is described as a tetrahedral coordination sphere, the lone pairs are considered as the fourth ligand of the Sn(II).

The Sn(II) coordination in the material of the present invention is thus distinguished from an ideal ilmenite-type structure wherein the Sn(II) ions exhibit an octahedral coordination sphere of O ions.

Stacking Order

The material of the formula $SnTiO_3$ according to the first aspect of the present invention is comprised of layers (see FIG. 5a), wherein the layers are arranged parallel to each other and are stacked along an axis perpendicular to the sub-layer formed by the $O_6$-octahedra (c-axis).

A layer and its adjacent layer are stacked in a way that provides a sufficient distance between the lone pairs of Sn(II) ions and the closest O ions of the adjacent layers (see FIG. 5b). Thus, the stacking order of the layers in $SnTiO_3$ is determined by the positions of the Sn(II) ions, in particular by their electron lone pairs. The layers are stacked so that in the ideal undistorted material the Sn(II) ions of a layer have the same position as Ti atoms of an adjacent layer along an axis perpendicular to the sub-layer (c-axis). In case of distortions, this may no longer be the case, so that such materials may additionally have to be described by process-related features, i.e. features concerning the method for the preparation of the material.

As mentioned above, in the ideal undistorted material as opposed to distorted structures, the layers are stacked so that the Sn(II) ions of a layer have the same position as Ti atoms of an adjacent layer along an axis perpendicular to the sub-layer (c-axis). The stacking of the layers can be described by two stacking vectors S1 and S2. The stacking vectors describe the translation of a layer relative to an adjacent layer. According to the honeycomb structure motif, six stacking vectors are theoretically possible, but due to the trigonal symmetry of the honeycomb, only two of them are non-symmetry-equivalent. The layers in the crystal structure of the material according to the first aspect of the present invention are stacked so that each layer is translated relative to each adjacent layer by a stacking vector S1 or a stacking vector S2.

The stacking vectors S1 and S2 are described by two basis vectors x and y (see FIG. 3a). The basis vectors x and y are defined by the sides of a parallelogram (see FIG. 3a). The parallelogram is formed by the centers (geometric centers) of adjacent hexagons of the honeycomb structure. The parallelogram has a side having a length x and side having a length y.

The stacking vector S1 is a combined translation along the side having the length x by ⅔ x and along the side having a length y by ⅓ y. The stacking vector S2 is a combined translation along the side having the length x by ⅓ x and along the side having a length y by ⅔ y (see FIG. 3a). Thus, S2 describes a translation in reverse direction relative to S1. The stacking vectors S1 and S2 describe a translation relative to an adjacent layer within the a-b plane when viewed along the c-axis. A translation by S1 or S2 result in a translation of each Sn(II) ion of the layer so that it occupies the (undistorted or ideal) position on top of a Ti(IV) ion of an adjacent layer when viewed along the c-axis.

The stacking order can also be described by the sequence of the layers, e.g. ABC, wherein A, B and C are different individual layers (see FIG. 2). The sequence of the individual layers is also referred to as the stacking order. The different individual layers A, B and C are translated relative to each other when viewed along an axis perpendicular to the a-b plane (c-axis). All individual layers having the same index, e.g. A, B or C, are superimposed along the axis perpendicular to the sub-layer formed by the edge-sharing $O_6$-octahedra (c-axis). In other words, all individual layers having the same index are not translated relative to each other along x or y.

In an ideal ilmenite-type structure, only stacking vectors into one direction, either S1 or S2, are present. Therefore, in an ideal ilmenite-type structure, the overall stacking order reduces to ABC (or ACB), wherein A, B and C are three different individual layers. In contrast, the crystal structure of the material according to the first aspect of the present invention comprises layers translated relative to adjacent layers by the stacking vector S1 and layers translated relative to adjacent layers by the stacking vector S2. Thus, crystal structures with various further stacking orders such as AB, ABCB and ABCACB can be obtained (see FIGS. 2 and 11, and Table 2). Such distinct stacking orders are also referred to as polytypes.

In the material according to the first aspect of the present invention, the ratio of the recurrence of the translation of a layer relative to an adjacent layer by the stacking vector S1 to the recurrence of the translation of a layer relative to an adjacent layer by the stacking vector S2 is preferably in the range of 0.1 to 9, more preferably in the range of 0.25 to 4, even more preferably in the range of 0.5 to 2, and most preferably in the range of 0.8 to 1.3. The ratio may also be 1. As a result, numerous polytypes characterized by different stacking orders can be obtained.

In other words, in an ideal ilmenite-type structure, the O ions are close-packed, specifically hexagonal close-packed in all directions, i.e. in a, b and c direction (see FIG. 25b). In contrast, as shown in FIG. 25a, in the material of the present invention, only the O ions within an individual layer are close-packed and do not form a (hexagonal) close packing with O ions of adjacent layers. Hence, the material of the present invention does not exhibit a hexagonal close packing of O ions in c-direction.

Free-Standing Material

The material according to the first aspect of the present invention is free-standing. Free-standing within the meaning of the present invention means that the structure, in particular the crystal structure, of the material according to the first aspect of the present invention is stable as such. In other words, the crystal structure and the macroscopic structure of the material according to first aspect of the present invention can be maintained without the presence of a substrate or a supporting layer stabilizing or supporting it. Accordingly, the material according to the second aspect of the present invention is also free-standing.

The material according to the first and second aspect of the present invention can be provided as thin layer having a thickness of 500 nm or less, preferably 200 nm or less, more preferably 10 nm or less and most preferably 0.5 to 5 nm.

Material of the Formula $SnTiO_3$ Having a Tetragonal Perovskite-Type Crystal Structure As mentioned above, in a second aspect, the present invention is directed to a material of the formula $SnTiO_3$ having a tetragonal perovskite-type crystal structure, wherein the Ti(IV) ions are optionally substituted with M, which is one or more elements selected from Group 4 and Group 14 elements. Up to 25 mol %, preferably up to 10 mol %, and more preferably up to 5 mol % of the titanium may be substituted with M.

Hence, the material according to the second aspect of the present invention may have the formula $SnTi_{1-x}M_xO_3$ with x being in the range of 0 or more and 0.25 or less. M is preferably one or more elements selected from the group of Si, Ge, Zr and Hf, and is more preferably one or more elements selected from the group consisting of Zr and Hf. Generally, the substitution of Ti(IV) may induce a distortion, in particular when Ti is substituted with one or both of Zr and Hf.

Method for the Preparation of $SnTiO_3$

A third aspect of the present invention is a method for the preparation of $SnTiO_3$, the method comprising the steps of (1) Reacting an alkali metal salt and titanium(IV) oxide to obtain a layered alkali metal titanate;
(2) Ion-exchanging the layered alkali metal titanate with a tin (II) salt to obtain a tin-exchanged alkali metal titanate; and
(3) Dehydrating the tin-exchanged alkali metal titanate in an oxygen free atmosphere and subsequently annealing in an oxygen free atmosphere below the temperature at which the disproportionation of tin (II) occurs, thus obtaining $SnTiO_3$, wherein titanium of the titanium(IV) oxide is optionally substituted with M, which is one or more elements selected from Group 4 and Group 14 elements.

The method for the preparation of $SnTiO_3$ of the present invention is displayed in the flowchart of FIG. 26 showing the steps of reacting an alkali metal salt and titanium(IV) oxide (1); ion-exchanging the layered alkali metal titanate with a tin (II) salt (2); dehydrating the tin-exchanged alkali metal titanate in an oxygen free atmosphere (3a) and subsequently annealing in an oxygen free atmosphere (3b).

Preparation of a Layered Alkali Metal Titanate

In step 1 of the method of the present invention, a mixture of an alkali metal salt and a titanium(IV) oxide are reacted to obtain a layered alkali metal titanate. The alkali metal salt and the titanium(IV) oxide are preferably mixed by grinding or milling. The reaction temperature is preferably in the range of 400 to 800° C., more preferably at 500 to 700° C., and most preferably at 550 to 650° C., and the mixture is preferably heated for at least one hour, more preferably for at least 6 hours, and most preferably for 12 hours. The reaction may be performed in air or in an oxygen free atmosphere, preferably in air. Generally, the reaction temperature depends on the reactants used and desired target layered titanate. The reaction of $K_2CO_3$ and titanium(IV) oxide to form $K_2Ti_2O_5$ is preferably performed at 600° C. The reaction of $Li_2CO_3$ and titanium(IV) oxide to form $Li_2TiO_3$ is preferably performed at 700° C.

The alkali metal salt used in step 1 for the preparation of a layered alkali metal titanate is preferably an alkali metal carbonate, more preferably $K_2CO_3$ or $Li_2CO_3$, and most preferably $K_2CO_3$.

The titanium(IV) oxide used in step 1 for the preparation of a layered alkali metal titanate may be in the form of nanoparticles or a fine powder and may contain rutile and/or anatase. The content of anatase is preferably 50 wt % or more, and more preferably 75 wt %. The titanium(IV) oxide is preferably titanium(IV) oxide nanoparticles, and more preferably titanium(IV) oxide nanoparticles having an average particle diameter of 25 nm or less. The titanium(IV) oxide may be substituted with M, wherein M is one or more elements selected from Group 4 and Group 14 elements. Up to 25 mol %, preferably up to 10 mol %, and most preferably up to 5 mol % of the titanium is substituted with M. M is preferably one or more elements selected from the group of Si, Ge, Zr and Hf, and is more preferably one or more elements selected from the group consisting of Zr and Hf.

The layered alkali metal titanate is preferably $K_2Ti_2O_5$ or $Li_2TiO_3$ and more preferably $K_2Ti_2O_5$.

Ion Exchange

In step 2 of the method of the present invention, the layered alkali metal titanate obtained in step 1 is ion-exchanged with a tin (II) salt to obtain a tin-exchanged alkali metal titanate. The ion exchange is a cation exchange of the layered alkali metal titanate. More particularly, in the ion exchange, tin (II) ions are fully or partially substituted for the alkali metal ions of the layered alkali metal titanate, so that a tin-exchanged alkali metal titanate is obtained.

Preferably, at least 95%, more preferably at least 99% of the alkali metal ions are replaced by tin (II) in the ion exchange.

The tin (II) salt is not particularly limited and is preferably one or more salt selected from the group of tin (II) halogenide, tin (II) sulfate, tin (II) nitrate, tin (II) phosphate, tin (II) hydrogen phosphate, tin (II) acetate, tin (II) oxalate, tin (II) carbonate, and tin (II) hydrogen carbonate, more preferably a tin (II) halogenide, even more preferably a tin (II) halogenide hydrate, and most preferably tin (II) chloride dihydrate.

The ion-exchange in step 2 can be performed by mixing the layered alkali metal titanate and the tin (II) salt, preferably at a temperature of 60° C. or lower, and more preferably at a temperature in the range of 0 to 50° C. Mixing at a temperature above 60° C. in air may result in the undesired formation of SnO or $SnO_2$. Mixing at temperatures below 0° C. may result in a too low reaction rate of the ion-exchange. Mixing in an oxygen free atmosphere can be performed at a temperature of 90° C. or lower, preferably at 70° C. or lower, and most preferably at 60° C. or lower. The mixing may involve grinding or milling the layered alkali metal titanate and the tin (II) salt. The mixing is preferably performed at least until a yellow (in particular a lemon yellow) powder is formed.

Alternatively, the ion-exchange in step 2 can be performed by combining the layered alkali metal titanate, the tin (II) salt, and an aqueous medium, dispersing the layered alkali metal titanate and the tin (II) salt to obtain a dispersion in the aqueous medium, and stirring the dispersion at a temperature of 70° C. or lower. A higher temperature may result in the undesired formation of SnO or $SnO_2$. The dispersion is preferably stirred at least until a yellow (in particular a lemon yellow) powder is formed.

Dehydration and Annealing

In step 3 of the method of the present invention, the tin-exchanged alkali metal titanate obtained in step 2 of the method of the present invention is dehydrated in an oxygen free atmosphere and subsequently annealed in an oxygen free atmosphere below the temperature at which the disproportionation of tin (II) occurs, thus obtaining $SnTiO_3$.

The disproportionation of tin (II) to tin (0) and tin (IV) occurs at about 350° C. The disproportionation temperature depends on the reaction conditions such as the pressure, the oxygen and water content of the reaction medium, and the presence of other substances, which may catalyze the disproportionation. Thus, under specific reaction conditions, the disproportionation temperature may also be above 350° C.

The dehydration is preferably performed until a water content of below 5 wt %, more preferably below 3 wt %, and most preferably below 1 wt %, in terms of the tin-exchanged alkali metal titanate, is achieved.

Dehydrating in an oxygen free atmosphere occurs preferably under vacuum or in an inert gas flow. Suitable inert gases are nitrogen, argon, helium, and mixtures thereof, and preferably nitrogen. The vacuum is preferably a dynamic vacuum.

The dehydration in step 3 occurs preferably at a temperature below 250° C., and more preferably below 200° C. The dehydration can involve a first dehydration step 3a at a temperature in the range of 100 to 150° C. and a subsequent second dehydration step 3b at a temperature in the range of above 150 to below 250° C., preferably in the range of above 150 to 200° C. The first dehydration step 3a is preferably performed for 0.25 to 5 hours, more preferably for 1 to 4 hours, and most preferably for 2 to 3 hours. The second dehydration step 3b is also preferably performed for 0.25 to 5 hours, more preferably for 1 to 4 hours, and most preferably for 2 to 3 hours.

After the dehydration, the tin-exchanged alkali metal titanate is annealed in an oxygen free atmosphere. Annealing in an oxygen free atmosphere occurs preferably under vacuum or in an inert gas flow. Suitable inert gases are nitrogen, argon, helium, and mixtures thereof, and preferably nitrogen. The vacuum is preferably a dynamic vacuum.

The annealing occurs at an annealing temperature in the range of 250 to 400° C., preferably in the range of 250 to 350° C., and most preferably in the range of 275 to 325° C. The tin-exchanged alkali metal titanate is preferably annealed at the annealing temperature for 1 to 48 hours, more preferably for 3 to 36 hours, and most preferably for 6 to 24 hours.

The dehydration and the annealing in step 3 can be performed by continuously heating the tin-exchanged alkali metal titanate obtained in step 2 in an oxygen free atmosphere to the annealing temperature with a heating rate of 5° C./min or less, preferably 3° C./min or less, and more preferably 1° C./min or less. The annealing temperature is preferably in the range of 250 to 400° C., more preferably in the range of 250 to 350° C., and most preferably in the range of 275 to 325° C. The tin-exchanged alkali metal titanate is preferably annealed at the annealing temperature for 1 to 48 hours, more preferably for 3 to 36 hours, and most preferably for 6 to 24 hours.

When dehydration and annealing are performed by continuously heating, the heating rate is preferably adjusted so as to ensure sufficient dehydration before the heating temperature exceeds 250° C. Hence, when dehydration and annealing are performed by continuously heating the tin-exchanged alkali metal titanate obtained in step 2 to the annealing temperature, the water content is preferably below 1 wt % in terms of the tin-exchanged alkali metal titanate before the temperature exceeds 250° C., and is more preferably below 0.5 wt % before the temperature exceeds 220° C., and most preferably below 0.5 wt % before the temperature exceeds 200° C.

Washing and Drying

The method of the present invention may comprise an additional step 4 of washing and drying the $SnTiO_3$. The washing can be performed after the annealing, preferably after cooling to a temperature of 60° C. or less. The washing step allows the removal of the alkali metal salt formed from the alkali metal of the alkali metal titanate and the anion of the tin (II) salt. The solvent used in the washing step is a polar solvent or a mixture of polar solvents, preferably one or more solvents selected from the group of water, methanol, ethanol, isopropanol and acetone, and most preferably water and/or ethanol. The washing step may involve one or more steps of washing the $SnTiO_3$ obtained in step 3, wherein the same or a different solvent or mixture of solvents may be used in each step. Washing may involve filtering, suspending, centrifuging or decanting the $SnTiO_3$ after the addition of the solvent.

After washing, the $SnTiO_3$ is subsequently dried. Drying may occur at temperatures in the range of 20 to 250° C., preferably in the range of 50 to 150° C., and most preferably in the range of 70 to 120° C. Drying may be static drying, drying in a gas flow or drying under vacuum.

Inducing Phase Transition

Generally, the temperature and cooling after annealing may affect the structure of the material of the present invention, due to a phase transition point in the temperature range of 30 to 100° C., as will be detailed in the following. Thus, a phase transition can be induced after annealing during cooling, during washing or during drying the $SnTiO_3$ material of the present invention. The phase transition may also be induced by a separate subsequent step after annealing, for example by heating the material to a temperature above the phase transition point and subsequent cooling.

A phase transition was found to occur in the range of 30 to 100° C., preferably in the range of 35 to 80° C., and most preferably in the range of 40 to 60° C., due to a phase transition point in this temperature range. For the following considerations, the term low-temperature phase refers to the thermodynamically stable phase below the phase transition point and the term high-temperature phase refers to the thermodynamically stable phase above the phase transition point.

The high temperature phase is assumed to have a higher symmetry compared to the low-temperature phase. Inducing phase transition allows the preparation of $SnTiO_3$ in the low-temperature phase having a non-centrosymmetric structure. More particularly, inducing phase transition allows the preparation of $SnTiO_3$ having a layered crystal structure comprised of non-centrosymmetric layers. Hence, it is expected that a $SnTiO_3$ material which exhibits ferroelectricity can be obtained.

For inducing the phase transition to form the low-temperature phase, the material is preferably cooled from a temperature above the phase transition point to a temperature below the phase transition at a cooling rate of 0.1° C./min or lower. For the stabilization of the high-temperature phase, the material is preferably cooled to room temperature at a rate of 1 C°/min or higher, which is also referred to as quenching, either directly from the annealing temperature of step 3 of the present invention or any other temperature higher than the phase transition point. If the high-temperature phase is to be induced by a separate subsequent step, the material of the present invention may for example by annealed at a temperature above the phase transition point until the phase transition is completed and subsequently be cooled to room temperature at a rate of 1 C°/min or higher. Washing and drying may also be performed after a phase transition has been induced.

Generally, the crystal structure of the materials of the present invention can be determined, and the low- and high-temperature phases be distinguished, by X-ray powder diffraction (XRPD). For details, please refer to the section entitled "X-ray powder diffraction (XRPD)".

High-Pressure Phase Transition

The method of the present invention may comprise an additional step of exposing the $SnTiO_3$ to a pressure of 4 GPa or more, preferably 6 GPa or more, and more preferably 8 GPa or more, to obtain $SnTiO_3$ having a perovskite-type structure, in particular a tetragonal perovskite-type crystal structure. The $SnTiO_3$ having a perovskite-type structure may exhibit ferroelectric or piezoelectric properties. In this additional step of exposing the $SnTiO_3$ to a pressure, the pressure is even more preferably 15 GPa or more, and most preferably 20 GPa or more.

The $SnTiO_3$ having a perovskite-type structure obtained by exposure to high pressure may be quenched before the pressure is released so that a phase transition during and after pressure release is suppressed. Quenching is preferably performed by cooling the $SnTiO_3$ having a perovskite-type structure from the annealing temperature to the temperature at which the perovskite-type structure is stable with an average cooling rate of 1° C./s or more, more preferably with a cooling rate of 2° C./s or more, and most preferably 5° C./s or more. In the context of the present invention, a phase is considered stable if it is thermodynamically stable or if the phase transition to a thermodynamically more stable phase is kinetically inhibited.

FIG. 27 shows the X-ray powder diffraction patterns of $SnTiO_3$ exposed to a maximum pressure of 18.1 GPa (solid gray line) and 20.8 GPa (interrupted line), respectively. The dataset has been obtained from synchrotron radiation at 0.28 A. The measurements have been carried out in a Diamond Anvil Cell using Neon as the pressure medium. The pressure was gradually increased from ambient pressure to the maximum pressure. The reflections at about 8.5°, 9.75° and 13.75° are assigned to crystallized Neon. The marked peak positions (vertical solid black lines) show the predicted intensities and peak positions of a tetragonal perovskite at ambient pressure.

The two diffractograms show the typical shift in peak positions due to compression of the lattice parameters of relatively soft materials. The X-ray powder diffraction pattern of $SnTiO_3$ exposed to a maximum pressure of 18.1 GPa is similar to the diffraction pattern of the layered $SnTiO_3$ from FIG. 6. The small increased intensity at about 6.1° of the pattern at 20.8 GPa is indicative for the formation of a phase that is different from the layered $SnTiO_3$ according the first aspect of the present invention. If a peak shift due to high pressure is assumed, the peak position very well fits the highest intensity reflections of the predicted tetragonal perovskite as indicated by the vertical lines. The very small overall intensity however does not allow the assignment of any further reflections from the obtained dataset. The data thus indicates that the material transforms into the high pressure modification at a pressure of about 20 GPa. (Pressure-) quenching of the structure will then possibly give a stable tetragonal modification at ambient conditions.

Material Obtainable by the Method of Preparation

The method of preparation according to the third aspect of the present invention gives a material according to the first or second aspect of the present invention, in particular according to the first aspect of the present invention. In addition, the method of the present invention may result in a material wherein the Ti(IV) ions, the ions M which may partially substitute Ti(IV) ions and/or the Sn(II) ions exhibit a distorted coordination sphere and/or do not occupy centered positions throughout the entire structure (e.g. within the octahedra and the hexagons, respectively). Such $SnTiO_3$ and $SnTi_{1-x}M_xO_3$ materials, respectively, exhibit Sn(II) ions in between close-packed (sub-)layers of O ions, which are constituted by two atomic layers of O ions and ⅔ of the octahedral voids of which (sub-)layers of O ions are filled with Ti(IV) ions. These materials as such are another aspect of the present invention. They have a crystal structure of low symmetry and it is impossible to define their crystal structure beyond the above definition, other than in terms of a process of manufacturing them. Such materials, additionally defined by their manufacturing method, are the subject of the fourth aspect of the present invention.

In a fourth aspect, the present invention is directed to a material of the formula $SnTiO_3$ obtainable by the method of preparation according to the third aspect of the present invention, wherein Ti is optionally substituted with M, which is one or more elements selected from Group 4 and Group 14 elements. M is preferably one or more elements selected from the group of Si, Ge, Zr and Hf, and is more preferably one or more elements selected from the group consisting of Zr and Hf. Thus, the material may have the formula $SnTi_{1-x}M_xO_3$ with x being in the range of 0 or more and 0.25 or less.

The material of the formula $SnTiO_3$ obtainable by the method of preparation according to the third aspect of the present invention may have a layered crystal structure comprised of non-centrosymmetric layers. Therefore, the material can be expected to exhibit ferroelectricity.

Ferroelectric Properties

The materials according to the first and second aspect of the present invention and the material prepared by the method of preparation according to the third aspect of the present invention may have a non-centrosymmetric symmetry and can thus be expected to exhibit ferroelectricity.

Ferroelectricity is based on the coupling of internal electric dipoles of a material to the lattice of the material. Thus, a change of the lattice results in a change in the spontaneous polarization. Two parameters affecting the lattice dimensions of a material are force and temperature. The generation of a surface charge in response to the application of an external stress to a material is called piezoelectricity. A change in the spontaneous polarization of a material in response to a change in temperature is called pyroelectricity. There are 21 non-centrosymmetric classes, within which 20 are piezoelectric. Among the piezoelectric classes, 10 are pyroelectric, i.e. they have a spontaneous electric polarization which varies with the temperature. Among pyroelectric materials, some of them are ferroelectric. Ferroelectric crystals often show several transition temperatures and domain structure hysteresis, similar to ferromagnetic crystals.

The material according to the second aspect of the present invention may also exhibit ferroelectricity.

In order to enhance the ferroelectric properties of the material of the present invention, a phase transition may be induced in the materials.

Due to its potential ferroelectricity, the materials of the present invention can be used in a ferroelectric element or a device as a ferroelectric material.

Device Comprising a Ferroelectric Material

As mentioned above, the fifth aspect of the present invention relates to a device comprising a ferroelectric material, wherein the ferroelectric material comprises at least one material selected from the group of the material according to the first aspect of the present invention, the material according to the second aspect of the present invention, and the material according to the fourth aspect of the present invention.

The device comprising a ferroelectric material may be a device selected from the group of a ferroelectric capacitor, such as a ferroelectric random-access memory or a tunable capacitor, ferroelectric tunnel junction element (FTJ), a multiferroic element, a piezoelectric for ultrasound imaging, an actuator, an electro-optical material for data storage applications, a thermistor, a switch such as a transcharger or a transpolarizer, an oscillator, a filter, a light deflector, a modulator, a display, and the like.

A ferroelectric capacitor is a capacitor based on a ferroelectric material. In contrast, traditional capacitors are based on dielectric materials. The ferroelectric capacitor can be used in digital electronics as data storage device. More particularly, the ferroelectric capacitor can be used as part of a ferroelectric random-access memory (Ferroelectric RAM).

In a ferroelectric random-access memory, a ferroelectric layer is used instead of a dielectric layer to achieve non-volatility of the stored data, so that information is maintained even when power is turned off.

The ferroelectric capacitor can also be used in analog electronics as a tunable capacitor. For example the ferroelectric capacitor can be used as a voltage-controlled capacitor.

A ferroelectric tunnel junction element comprises a ferroelectric layer placed between metal electrodes, wherein the thickness of the ferroelectric layer is in the nanometer range and small enough to allow tunneling of electrons.

A multiferroic element is a material wherein the magnetic and ferroelectric ordering within the material is coupled. A thermistor is a resistor whose resistance is dependent on temperature, wherein the temperature dependency is significantly more pronounced than in a standard resistor.

An actuator is a component of a machine responsible for moving and controlling a mechanism or system.

Use in a Ferroelectric Element

These aspects of the present invention relate to a use of the material according to the first and second aspect of the present invention and the material according to the fourth aspect of the present invention in a ferroelectric element. A ferroelectric element within the meaning of the present invention is any element or component whose function is based on ferroelectricity.

Use as High-k Dielectric

In a last aspect, the present invention relates to a use of the material according to the first and second aspect of the present invention and the material according to the fourth aspect of the present invention as high-k dielectric.

The term high-k dielectric refers to a material with a high dielectric constant K as compared to silicon dioxide. High-k dielectrics are used in semiconductor manufacturing processes where they are usually used to replace a silicon dioxide gate dielectric or another dielectric layer of a device.

High dielectric constants require polarizability in a wide range of frequency. For most applications the microwave region is of highest interest. Here, materials with less strongly bound valence electrons (such as lone pairs) and intrinsic dipoles due to structural distortions (such as distorted $TiO_6$-octahedra) are of advantage. $BaTiO_3$ and also $Pb(Zr,Ti)O_3$ have been considered as high-k candidates due to their high permittivity, which usually peaks in the phase transitions. A promising phase transition has also been found in $SnTiO_3$ (FIGS. 17 and 19). Additionally, $SnTiO_3$ offers advantages for the thin film processing due to its pronounced two-dimensional character, namely its layered structure.

EXAMPLES AND CALCULATIONS

Preparation

Figure 1:
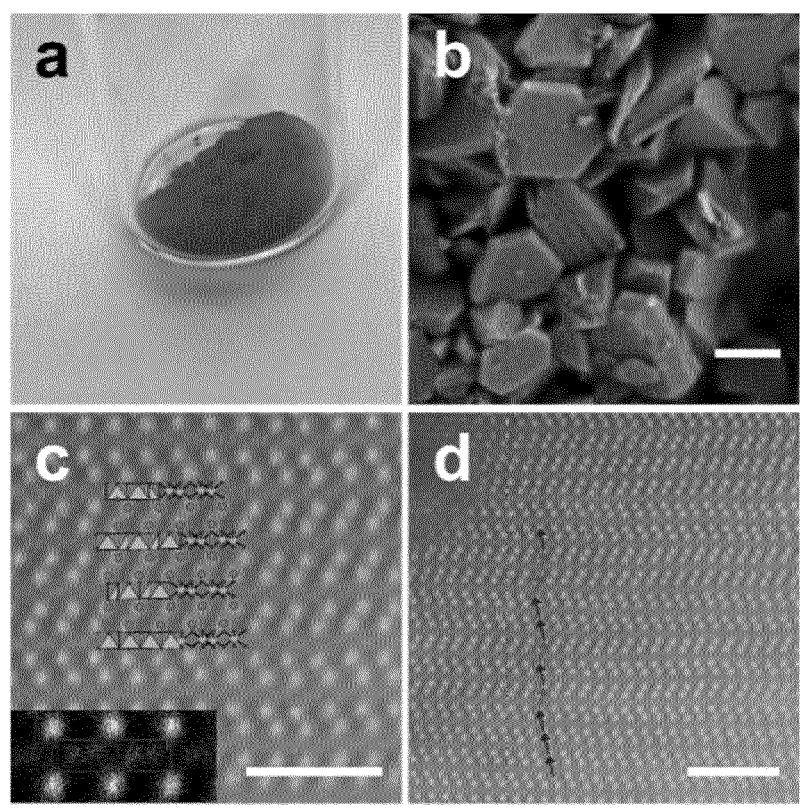
FIG. 1a is a picture of red $SnTiO_3$ powder as a material according to the present invention.
FIG. 1b is a scanning electron micrograph of the material of the present invention (scale bar 200 nm).
FIG. 1c is a high resolution scanning transmission electron micrograph (HR-STEM) of the material of the present invention with a structure as an inset (scale bar 2 nm) and an inset with enhanced contrast showing the Titanium positions.
FIG. 1d is a high resolution scanning transmission electron micrograph of the material of the present invention showing different stacking polytypes with respective stacking vectors illustrated (scale bar 3 nm).

As introduced above it is experimentally challenging to avoid the disproportionation of Sn(II) into Sn(0) and Sn(IV). In order to bypass this scenario a layered potassium titanate precursor was synthesized to enable a low temperature ion exchange reaction from potassium to tin. First a mixture of $K_2CO_3$ and $TiO_2$-Nanoparticles (P25) were heated up to 600° C. in air for 12 hours. Then the formed layered potassium titanate precursor $K_2Ti_2O_5$ was ground together with $SnCl_2 \cdot 2\ H_2O$ until a lemon yellow powder formed. This powder was transferred into an ampoule and dehydrated in two steps: 2.5 hours at 130° C. and then another 2.5 hours at 200° C. under dynamic vacuum respectively. Eventually the powder was annealed at 300° C. for 24 hours under static vacuum until $SnTiO_3$ formed. For removal of KCl the obtained $SnTiO_3$ powder was washed twice with $H_2O$ and once with ethanol. A homogeneous powder of red color was obtained (FIG. 1a). Small platelets of several hundreds of nanometers in lateral and few tens nanometers in axial direction formed (FIG. 1b).

Characterization

Elemental Analysis

Table 1 shows the results of the elemental analysis of different washed batches of the material obtained by the above-described preparation method using inductively coupled plasma atomic emission spectrometry. For elemental analysis a VARIAN VISTA RL CCD Simultaneous ICP-AES was used. The results of the elemental analysis confirm the stoichiometry $SnTiO_3$.

TABLE 1

Elemental analysis by ICP-AES of different washed batches of $SnTiO_3$.

|  | K | Sn | Ti |
|---|---|---|---|
| $SnTiO_3$-I |  | 4.54 | 4.20 |
| $SnTiO_3$-II |  | 2.54 | 2.70 |
| $SnTiO_3$-III | 0.04 | 4.36 | 4.31 |
|  | 0.04 | 3.81 | 3.74 |

Thermal Gravimetric Analysis

Thermal gravimetric analysis measurement of the material obtained by the above-described preparation method in air shows a weight increase of the material at about 350° C. (see FIG. 10). Thus, the oxidation state+II of Sn was indirectly proven by oxidation of $SnTiO_3$ in air to $SnO_2$ and $TiO_2$. The obtained weight increase of ~5 wt % is in decent accordance with a theoretical value of ~7 wt %. The small deviation can be explained by partially oxidized surface species.

Scanning Transmission Electron Microscopy (STEM)

The samples were prepared from a sonicated mixture of the powder sample with pure ethanol. This mixture was drop cast onto a copper grid with a holey carbon film. Low loss EELS acquisition and Cs corrected STEM images were acquired with a FEI TitanThemis 60-300 equipped with an aberration-corrector for the probe-forming lens system, a high brightness field emission (XFEG™) source, a monochromator and a high-resolution electron-energy loss spectrometer (Gatan 966 GIF) operated at 3000 kV.

EELS data were acquired in monochromated STEM spot mode featuring an energy resolution of 0.2 eV. A dispersion of 0.1 eV was used for the spectrum acquisition. Subpixel-scanning and short acquisition times were used to avoid electron beam induced damage of the sample.

STEM revealed a layered type structure confirming the macroscopic platelet-morphology (FIG. 1d). It is apparent that the structure is heavily stacking faulted (as indicated by the two stacking vectors S1 and S2) and shows no type of regular superstructure ordering.

X-Ray Powder Diffraction (XRPD)

A Stoe STADI P diffractometer ($Mo_{K\alpha 1}$ radiation, Ge(111) monochromator, Mythen detector) was used for powder diffraction measurements in Debye-Scherrer geometry and TOPAS 6.0 for structure refinement.

Due to the heavily stacking faulted nature (STEM in FIGS. 1a and 1b) indexing attempts using ilmenite derived symmetry and also an iterative use of singular value decomposition for indexing (LSI-indexing) the X-ray powder diffraction pattern as described by S. Bette et al., *Journal of Applied Crystallography* 48 (2015) 1706, were not possible.

An incipient structural model of bulk $SnTiO_3$ was derived from the predictions made by T. Fix et al. *Crystal Growth & Design* 11 (2011) 1422. According to that prediction, $SnTiO_3$ is expected to crystallize in an ilmenite-type structure.

The diffraction patterns of the material according to the first aspect of the present invention were successfully modelled by the superposition of differently stacked hypothetical polytypes (see Table 2). In total five distinct polytypes, representing five different stacking orders were considered.

In all five crystal structures the layers are described by two tin sites, two titanium sites and six oxygen sites. The coordinates were refined in real space, in order to keep an identical layer constitution within one polytype and throughout all polytypes. In addition, the z-coordinates for the three oxygen sites were constrained, as well. The only parameters that were refined for each polytype individually were the scale factors to account for the different relative frequencies of the stacking patterns and the crystalline size parameters to account for different expansions of the coherently scattering domains.

It was assumed that a change in the stacking order of the $SnTiO_3$-layers does neither cause a variation of the layer constitution nor a deviation from the basic trigonal layer symmetry, as further supported by electron energy loss spectroscopy (EELS) and Density Functional Theory (DFT). Rietveld refinement of $SnTiO_3$ was carried out by the program TOPAS 6.0 2017, Bruker AXS. $SnO_2$ and $K_2Ti_8O_{17}$ occur as minor impurity phases and were included in the refinement (see FIG. 6).

TABLE 2

Refined lattice parameters of five polytypes of $SnTiO_3$ representing distinct stacking orders at ambient conditions.

| Polytype Space Group | ABC-type R3 | ABC-type P3 | ABC-type R3 | ABCB-type P3 | ABCACB-type P3 |
|---|---|---|---|---|---|
| a/Å | 5.0750(2) | 5.0750(2) | 5.0750(2) | 5.0750(2) | 5.0750(2) |
| b/Å | 5.0750(2) | 5.0750(2) | 5.0750(2) | 5.0750(2) | 5.0750(2) |
| c/Å | 3 · 6.8961(3) | 2 · 6.8961(3) | 3 · 6.8961(3) | 4 · 6.8961(3) | 6 · 6.8961(3) |
| α/° | 90 | 90 | 90 | 90 | 90 |
| β/° | 90 | 90 | 90 | 90 | 90 |
| γ/° | 120 | 120 | 120 | 120 | 120 |
| V/Å³ | 3 · 153.82(2) | 2 · 153.82(2) | 3 · 153.82(2) | 4 · 153.82(2) | 6 · 153.82(2) |
| R-F²/%[a] | 4.00 | 3.30 | 4.39 | 4.36 | 4.22 |

Accordingly, the five hypothetical polytypes were created in a pseudotrigonal cell with space group P1 and constrained lattice parameters, which were determined by a LeBail-Fit as described in A. Le Bail et al., *Materials Research Bulletin* 23 (1988) 447, with peak profiles being modeled by the fundamental parameter approach described in R. W. Cheary et al. *Journal of Applied Crystallography* 25 (1992), 109.

The refined atomic coordinates of one individual layer are presented in Table 3 and the result of the final associated Rietveld-refinement is shown in FIG. 6.

TABLE 3

Refined atomic coordinates of a layer in the crystal structure of $SnTiO_3$ at ambient conditions.

| site | $x^a$ | $y^a$ | $z^{a,b}$ | site | $x^a$ | $y^a$ | $z^{a,b}$ |
|---|---|---|---|---|---|---|---|
| Ti(1) | 0 | 0 | 0.0014(26) | Ti(2) | 2/3 | 1/3 | −0.010(28) |
| Sn(1) | 1/3 | 2/3 | −0.320(2) | Sn(2) | 1/3 | 2/3 | 0.322(2) |
| O(1a) | 1/3 | 0 | 0.160(12) | O(2a) | 1/3 | 1/3 | −0.140(10) |
| O(1b) | 0 | 1/3 | 0.160(12) | O(2b) | 2/3 | 0 | −0.140(10) |
| O(1c) | 2/3 | 2/3 | 0.160(12) | O(2c) | 0 | 2/3 | −0.140(10) |

[a] For creation of stacking polytypes, the layers have to be added by using the stacking vectors given in eq. 1.

$$S1 = \begin{pmatrix} 2/3 \\ 1/3 \\ 1/N \end{pmatrix} \quad S2 = \begin{pmatrix} 1/3 \\ 2/3 \\ 1/N \end{pmatrix} \quad \text{(eq. 1)}$$

[b] The z-coordinates are given for a unit cell containing one layer, i.e. c=6.8961(3) Å, for the creation of different stacking patterns, they must be divided by the total number of layers in the cell, N.

The crystal structure of $SnTiO_3$ consists of layers of edge-sharing $TiO_6$-octahedra perpendicular to the c-axis. The z-direction corresponds to the c-axis. Within the layers 1/3 of the Ti-sites are vacant which results in a honeycomb like lattice (FIG. 3a). $Sn^{2+}$ ions are positioned directly above and below a Ti-vacancy. The atomic distances are given in Table 4.

TABLE 4

Atomic distances in $SnTiO_3$ at ambient conditions.

| Atoms | Distance/Å | Atoms | Distance/Å |
|---|---|---|---|
| Ti(1) − O(1) | 1.99(9) × 3 | Sn(1) − O(1) | 2.10(4) × 3 |
| Ti(1) − O(2) | 1.98(10) × 3 | Sn(1) − O(2) | 3.97(8) × 3 |
| Ti(2) − O(1) | 1.92(10) × 3 | Sn(2) − O(1) | 2.03(5) × 3 |
| Ti(2) − O(2) | 2.05(11) × 3 | Sn(2) − O(2) | 4.08(6) × 3 |

The stacking of the material according to the first aspect of the present invention was further studied using the DIFFaX-program as described in M. M. J. Treacy et al. *Proceedings of the Royal Society of London. Series A: Mathematical and Physical Sciences* 433 (1991) 499. XRPD pattern of stacking faulted $SnTiO_3$ were simulated by using the DIFFaX-routine in recursive mode. For the simulation the refined layer constitution was used. The peak profiles were simulated using Pseudo-Voigt functions.

Various faulting models using different combinations of the stacking vectors S1 and S2 were simulated. Crystallographic intergrowth between ABC-type (stacking vector: S1), ACB-type (stacking vector: S2) and AB-type stacking (stacking vector: S1 and S2 in alternating fashion) was simulated by using a 4×4 transition probability matrix (see Table 5) with variable parameters, x and y, for the extension of the coherently stacked sections.

Table 5 Transition probability matrix with associated stacking vectors for the simulation of crystallographic intergrowth among ABC-, AB- and ACB. The extension of the AB-stacked section is described by the parameter x and the transitions among ABC/ACB-type and AB-type stacked section is described by the parameter y.

| Transition | | AB-type | | |
|---|---|---|---|---|
| From ↓/to → | ABC-type | layer 2n | layer 2n + 1 | ACB-type |
| ABC-type | vector: S1 | vector: S2 | vector: S1 | vector: S2 |
| layer 2n | probability: 1 − y | probability: y | probability: 0 | probability: 0 |
| | vector: S1 | vector: S2 | vector: S1 | vector: S2 |
| AB-type layer 2n + 1 | vector: S1 probability: x | probability: 0 vector: S2 probability: 1 − x | probability: vector: S1 probability: 0 | vector: S2 probability: 0 vector: S2 probability: x |
| ACB-type | probability: 0 vector: S1 probability: 0 | 1 − x vector: S2 probability: 0 | probability: 0 vector: 1 probability: y | vector: S2 probability: 1 − y |

Additional simulations were also carried out in which each transition from S1- to S2-stacking was considered as a fault that may obtain a certain range, in such a way that after the occurrence of a fault a minimum number of layers must be faultless. This was realized by 2i×2i transition probability matrixes (see Table 6) in which i−1 is the range of a fault and the variable parameter s (sharpness) being the probability of an additional fault after the minimum faulting range.

In each case a cohort of simulations was carried out in which only one parameter was varied systematically.

Table 6 Transition probability matrix with associated stacking vectors for the simulation of faults that obtain a certain range (i−1). The sharpness of the range is described by the parameter s.

| Transition | ABC-type | | Fault | | ACB-type | |
|---|---|---|---|---|---|---|
| From ↓/to → | Layer1 | ... | Layer i | Layer1 | ... | Layer i |
| ABC-type Layer1 | vector: S1 prob.: 0 | vector: S1 prob.: 1 | vector: S1 prob.: 0 | vector: S2 prob.: 0 | vector: S2 prob.: 0 | vector: S2 prob.: 0 |
| | vector: | vector: | vector: | vector: | vector: | vector: |
| ... | S1 prob.: 0 | S1 prob.: 0 | S1 prob.: 1 | S2 prob.: 0 | S2 prob.: 0 | S2 prob.: 0 |
| | vector: | vector: | vector: | vector: | vector: | vector: |
| Layer i | S1 prob.: 0 | S1 prob.: 0 | S1 prob.: 1-s | S2 prob.: s | S2 prob.: 0 | S2 prob.: 0 |
| | vector: | vector: | vector: | vector: | vector: | vector: |

-continued

| Transition | From ↓/ to → | ABC-type Layer1 | ABC-type ... | Fault Layer i | Fault Layer1 | ACB-type ... | ACB-type Layer i |
|---|---|---|---|---|---|---|---|
| Fault | Layer1 | S1 prob.: 0 vector: | S1 prob.: 0 vector: | S1 prob.: 0 vector: | S2 prob.: 0 vector: | S2 prob.: 1 vector: | S2 prob.: 0 vector: |
| ACB-type | ... | S1 prob.: 0 vector: | S1 prob.: 0 vector: | S1 prob.: 0 vector: | S2 prob.: 0 vector: | S2 prob.: 0 vector: | S2 prob.: 1 vector: |
|  | Layer i | S1 prob.: s | S1 prob.: 0 | S1 prob.: 0 | S2 prob.: 0 | S2 prob.: 0 | S2 prob.: 1-s |

The X-ray powder diffraction patterns of the basic stacking types ABC (FIG. 7), ACB and AB were simulated and compared to the measured X-ray powder diffraction pattern of $SnTiO_3$. Apparently, the measured pattern exhibits more reflections than each individual basic stacking type. A superposition of the three basic stacking types, however, exhibits good similarity to the measured pattern and especially to the characteristic "triplets" around 12.5°, 21° and 26° 2θ. The "outer" two reflections (104) and (015) correlate with ABC/ACB-type stacking (S1 or S2 only) while the "central" reflection (103) correlates with AB-type stacking (S1 and S2), respectively. It should be noted that differentiation between ABC- and ACB-type stacking from the X-ray powder diffraction pattern is very difficult as the simulated X-ray powder diffraction patterns (FIG. 7) exhibit the same number of reflections at identical positions only differing in certain reflection intensities. It can be concluded that in the microstructure of $SnTiO_3$ coherently scattering domains of each of these stacking types are present.

With further DIFFaX-simulations it becomes apparent that AB-type stacking does not completely describe the stacking fault nature (FIG. 13). If each transition of the stacking vector from S1 to S2 and vice versa is considered as a fault in terms of twinning, each twinning domain may have a certain expansion. In consequence each fault has a certain range. Various simulations of twinning using different ranges were carried out (FIG. 13). When the range is set to 0, twinning occurs purely statistically, accordingly an increasing fault probability leads to vast reflection broadening (FIG. 13 a). A further increase of the fault probability finally leads to transformation of the ABC/ACB-type XRPD pattern into an AB-type pattern. By increasing the range, the peak broadening due to an increase in fault probability is less pronounced (FIG. 13 b-d). Also the characteristic peak triplets at ≈9, 12-14, 20-21 and 26-27° 2θ occur in the simulated patterns. The greatest similarity between measured and simulated XRPD pattern is achieved by a range of 2 (FIG. 13 c). Hence, due to the very small coherently scattering domain, the central reflection would have a rather broad profile, which is not observed in the powder pattern. Only by additional consideration of twinning ranges bigger than zero and the respective stacking types (ABCB and ABCACB) the sharp reflection profile can be reproduced.

As the DIFFaX simulations suggest the presence of several coherently scattering domains, showing a homogeneous stacking order, the microstructure of the sample can be described by superposition of several phases. Hence, in a Rietveld-refinement (FIG. 14) the measured XRPD pattern was refined by using separated phases of $SnTiO_3$, each representing a different stacking order. An identical layer constitution for each phase was used. The only parameters that were refined individually were crystalline size parameters for describing the expansion of coherently scattering domains. In the Rietveld-refinement besides $SnTiO_3$ phases for describing the basic stacking orders ABC, ACB and AB, also two phases describing twinning domains, ABCB and ABCACB are used. In addition, the crystal structures of $SnO_2$ and $K_2Ti_8O_{17}$ were included as impurity phases.

The crystallite size, i.e. the expansion of the AB-type stacked coherently scattering domain was refined to a low value. Therefore, decomposition of the calculated pattern (FIG. 14) into the single components exhibits broad reflections for the AB-type stacked $SnTiO_3$ phase. This is in accordance with the systematic DIFFaX study. The other $SnTiO_3$ polytypes exhibit rather sharp reflections indicating a larger expansion of the associated coherently scattering domains. In summary the calculated patterns of all $SnTiO_3$ polytypes that were considered obtain substantial intensities, which means each of the stacking orders is present to a significant amount in the microstructure. The contribution of the impurity phases to the measured pattern (FIG. 6) is almost negligible (calculated content of $SnO_2$: 1.3 (1) wt-%, $K_2Ti_8O_{17}$: 3.1 (1) wt-%).

The measured X-ray powder diffraction pattern of the material according to the first aspect of the present invention is satisfactorily described (R-wp=10.54%, wherein R-wp is the weighted profile R-factor, which is a discrepancy index of the Rietveld refinement for judging the quality of Rietveld fits) by the multiphase approach. The largest difference between calculated and measured pattern can be observed at the 110 reflection (≈16° 2θ), which indicates that modelling of the twinning domain size by separate phases is not completely sufficient. An extension of the approach towards even more phases, however, would lead to an over-parametrization of the refinement. As the 110 reflection is unaffected by faulting, the result of the refinement can be considered as a semi-quantitative description of the microstructure of $SnTiO_3$.

Density Functional Theory Data

To further elucidate the stacking fault nature of the structure, DFT calculations on the relative stabilities of the different stacking types were performed: (1) ABC/ACB-type, (2) AB-type, (3) ABCB-type and (4) ABCACB-type. Independent of the applied exchange correlation functional (LDA, GGA, HSE06), all applied structural models differ by only less than 0.14 kJ mol$^{-1}$ (LDA; PBE: 0.06 kJ mol$^{-1}$; HSE06: 0.01 kJ mol$^{-1}$). These strikingly close energetic minima demonstrate well that at finite temperatures all stacking motifs will be present.

The obtained volume per formula unit with the HSE hybrid functional ($V_{FU}$) of ~77.5 Å$^3$ is in very good agreement with the 76.9 Å$^3$ from the Rietveld refinement. The increase of $V_{FU}$ from ~53 Å$^3$ in ordinary ilmenite-type structures (e.g. $FeTiO_3$) to the lone pair containing $SnTiO_3$ is in accordance with the increase observed from ~57 Å$^3$ in $SrTiO_3$ to 63 Å$^3$ in $PbTiO_3$. While the lone pair in $PbTiO_3$ is confined within two layers of corner sharing $TiO_6$-octahedra, the lone pairs in $SnTiO_3$ form van-der-Waals gaps as described in R. H. S. Winterton, 11 *Contemporary Physics* (1970), 559, and hence occupies more space (see also ELF in FIG. 2).

Electron Energy Loss Spectroscopy (EELS) FIG. 9 shows electron energy loss spectra of the Ti $L_{2,3}$ edge for different titanates. The Ti-$L_{2,3}$ edge shows the characteristic splitting of an octahedral crystal field and therefore confirms $TiO_6$-octahedra as major structural motif. Specifically, the $e_g$-level (at ~460 eV) is known to be sensitive towards tetragonal distortions in $PbTiO_3$. In contrast, trigonal distortions as in corundum-type $Ti_2O_3$ and other ilmenite-type materials do not have an effect on the $e_g$-level. As there is no peak splitting observable for $SnTiO_3$ it can therefore be concluded that potential distortions of the $TiO_6$-octahedra are constrained to $D_{3d}$ symmetry. Consequently, it is reasonable to only refine the z-coordinates of the atomic sites.

Detailed analysis of the Ti-$L_{2,3}$ gives a Crystal Field splitting (CFS) between 1.9 and 2.5 eV. The CFS was measured between peak C and D due to the reduced $e_g$-splitting. Interestingly, upon introduction of the lone pair the value reduces drastically in perovskite-type structures from 2.36 eV in $SrTiO_3$ to 1.91 eV in $PbTiO_3$, while in ilmenite-type derived structures it increases from about 2.06 eV in $FeTiO_3$ to 2.27 eV in $SnTiO_3$, while at the same time the $e_g$-peak decreases and the full width at half maximum (FWHM) increases similarly for both structure types[40]. This broadening has been explained by differing hybridizations of the involved orbitals and consequently differing transition probabilities[41].

High-Field Solid State Nuclear Magnetic Resonance Spectroscopy (ss-NMR)

$^{47,49}$Ti solid-state NMR spectra were obtained at a Larmor frequency of 50.73 MHz on a Bruker Avance II-900 instrument (magnetic field 21.1 T). A Bruker 4 mm low-γ MAS probe and a Bruker 7 mm single-channel MAS probe have been used. External referencing in $^{47,49}$Ti spectra was accomplished with a 1 M solution of $TiCl_4$ in $CCl_4$ (high frequency signal from $^{49}$Ti set to 0 ppm) and using solid $SrTiO_3$ as a secondary reference. A non-selective π/2 pulse was calibrated on $^{49}$Ti in liquid reference sample. FIDs were collected using Solid-Echo (π/2-τ-π/2-τ-acq) as described in E. L. Hahn, 80 *Physical Review* (1950) 580, and QCPMG (π/2-$\tau_1$-($\tau_2$-π-$\tau_3$-acq)$_n$) as described in F. H. Larsen et al., *Journal of Magnetic Resonance* 131 (1998) 144. Recycle delays ranged from 1 s to 6 s depending on the sample and complete relaxation of the signals was tested individually for each sample. Between 2000 and 20000 scans were acquired depending on the sample. The spectra were acquired in a single frequency offset.

Analytical simulations of experimental spectra were carried out with the DMFit and QUEST simulation packages as described in D. Massiot et al., *Magnetic Resonance in Chemistry* 40 (2002) 70, and F. A. Perras et al., *Solid State Nuclear Magnetic Resonance* 45 (2012) 36. Where available, the MAS spectra which provided the isotropic chemical shifts $\delta_{iso}$, quadrupolar constants $C_Q$ and quadrupolar asymmetry parameter $\eta_Q$ were fitted first. These parameters were subsequently used in simulations of the static powder patterns to obtain span Ω and sqew k, with the Euler angles are commonly set to those obtained from the quantum chemical calculations.

Calculations of $^{47,49}$Ti electric field gradient and nuclear magnetic shielding tensors in model titanates were accomplished using the available crystallographic data. Plane wave-based Density Functional Theory calculations were performed using the NMR module of the CASTEP DFT code that employs the Gauge Including Projector Augmented Wave (GIPAW) algorithm described by J. R. Yates et al. *Physical Review B* 76 (2007) 024401, and is a part of Biovia Materials Studio simulation and modelling package (Version 2017). This method is specifically designed for extended lattice structures of crystalline materials. The Perdew-Burke-Ernzerhof (PBE) functional was used with the Generalized Gradient Approximation (GGA) for all calculations, as described in J. P. Perdew et al., *Physical Review Letters* 77(1996) 3865, and J. P. Perdew et al., *Physical Review Letters* 78 (1997) 1396. The geometry optimization was performed using PBE functional with the convergence tolerance parameters set as follows: Energy: $10^{-5}$ eV/atom, Maximum force: 0.03 eV/A, Maximum stress: 0.05 GPa, Maximum displacement: $10^{-3}$ Å. The Euler angles relating the EFG tensor PAS to the CSA tensor PAS (α, β, γ) were extracted using the program EFG-Shield.

High-field solid state-NMR spectroscopy confirms the distortion of the $TiO_6$-octahedra (FIG. 4 and Table S 7). The obtained quadrupole constant $C_Q$ of $SnTiO_3$ is 7.29 MHz, which suggests that a local distortion at the Ti site is at play. However, contrast other compounds with ilmenite-type structure such as $CdTiO_3$ or $ZnTiO_3$ (Figure S 9 and Table S 7) show extremely large $C_Q$s with some exceeding 15 MHz. It is thus surprising that in contrast to the strong increase observed from undistorted $SrTiO_3$ to distorted perovskite-type $PbTiO_3$[44] the effect of the lone pair is reversed in $SnTiO_3$ as has also been seen in CFS from EELS. Since the Electric Field Gradient (EFG) is a function of the cell volume, a strong increase of the $V_{FU}$ from $FeTiO_3$ to $SnTiO_3$ could potentially level the effect of the lone pair. A still relatively high value of the experimental $C_Q$ together with the $\eta_Q$=0.0 suggest an axially symmetric distortion along the rotational axis higher than $C_2$. Periodic structure DFT calculations suggest values of about 6.04 MHz for $C_Q$. While the calculated value is smaller than the experimental one by 1.2 MHz, the agreement here is much better than for other models. This discrepancy should be connected to effects induced by the stacking faults as well as the large variation in the Ti-position within its octahedra. We note, that even at the very high field of 21.1 T, it was not possible to discriminate between different Ti sites.

SPECIFIC EMBODIMENTS

In the following, specific embodiments of the invention will be compiled:

(1) A material of the formula $SnTiO_3$ having a crystal structure comprised of layers,
wherein
the layers comprise Sn(II) ions, Ti(IV) ions and edge-sharing $O_6$-octahedra,
the edge-sharing $O_6$-octahedra form a sub-layer, i.e. a sublayer within each of the layers,
the Ti(IV) ions are located within ⅔ of the edge-sharing $O_6$-octahedra, thus forming edge-sharing $TiO_6$-octahedra,
the edge-sharing $TiO_6$-octahedra form a honeycomb structure within the sub-layer, the honeycomb structure comprising hexagons with Ti(IV)-vacancies within the hexagons,
the Sn(II) ions are located above and below the Ti(IV)-vacancies with respect to the sub-layer,
the Ti(IV) ions are optionally substituted with M,
M is one or more elements selected from Group 4 and Group 14 elements, and the Sn(II) ions have a tetrahedral coordination sphere involving three O ions of the layer and the electron lone pairs of the Sn(II) ions which are situated at an apical position relative to the three O ions of the layer.

(2) A material of the formula $SnTiO_3$ having a crystal structure comprised of layers, wherein the layers comprise Sn(II) ions, Ti(IV) ions and edge-sharing $O_6$-octahedra, the edge-sharing $O_6$-octahedra form a sub-layer, i.e. a sublayer within each of the layers, the Ti(IV) ions are located within ⅔ of the edge-sharing $O_6$-octahedra, thus forming edge-sharing $TiO_6$-octahedra, the edge-sharing $TiO_6$-octahedra form a honeycomb structure within the sub-layer, the honeycomb structure comprising hexagons with Ti(IV)-vacancies within the hexagons, the Sn(II) ions are located above and below the Ti(IV)-vacancies with respect to the sub-layer, the Ti(IV) ions are optionally substituted with M, M is one or more elements selected from Group 4 and Group 14 elements, and the layers are stacked so that each layer is translated relative to each adjacent layer by a stacking vector S1 or a stacking vector S2, the centers of adjacent hexagons form a parallelogram with a side having a length x and a side having a length y, the stacking vector S1 is a combined translation along the side having the length x by ⅔ x and along the side having a length y by ⅓ y, the stacking vector S2 is a combined translation along the side having the length x by ⅓ x and along the side having a length y by ⅔ y, and the crystal structure comprises layers translated relative to adjacent layers by the stacking vector S1 and layers translated relative to adjacent layers by the stacking vector S2.

(3) A material of the formula $SnTiO_3$ having a crystal structure comprised of layers, wherein the layers comprise Sn(II) ions, Ti(IV) ions and edge-sharing $O_6$-octahedra, the edge-sharing $O_6$-octahedra form a sub-layer, i.e. a sublayer within each of the layers, the Ti(IV) ions are located within ⅔ of the edge-sharing $O_6$-octahedra, thus forming edge-sharing $TiO_6$-octahedra, the edge-sharing $TiO_6$-octahedra form a honeycomb structure within the sub-layer, the honeycomb structure comprising hexagons with Ti(IV)-vacancies within the hexagons, the Sn(II) ions are located above and below the Ti(IV) vacancies with respect to the sub-layer, the Ti(IV) ions are optionally substituted with M, M is one or more elements selected from Group 4 and Group 14 elements, and the Sn(II) ions have a trigonal pyramidal coordination sphere involving three O ions of the layer with the Sn(II) ions at the apical position, and the distance of the Sn(II) ions to the closest O ion of an adjacent layer exceeds the distance of the Sn(II) ions to each of the three O ions in their trigonal pyramidal coordination sphere by a factor of 1.5 or more.

(4) The material according to any one of items 1 to 3, wherein the Ti(IV) ions are located in the center of the edge-sharing $O_6$-octahedra so that the Ti(IV) ions lie in a plane.

(5) The material according to any one of items 1 to 4, wherein the ratio of the recurrence of the translation of a layer relative to an adjacent layer by the stacking vector S1 to the recurrence of the translation of a layer relative to an adjacent layer by the stacking vector S2 is in the range of 0.1 to 9, preferably in the range of 0.25 to 4, more preferably in the range of 0.5 to 2, and most preferably in the range of 0.8 to 1.3.

(6) The material according to any one of items 1 to 5, wherein the crystal structure is non-centrosymmetric.

(7) The material according to any one of items 1 to 6, wherein the O ions of the edge-sharing $O_6$-octahedra within the sub-layer are close-packed and do not form a hexagonal close packing with O ions of adjacent layers.

(8) The material according to any one of items 1 to 7, wherein the Ti(IV)-vacancies are surrounded by six edge-sharing $TiO_6$-octahedra.

(9) The material according to any one of items 1 to 8, wherein the crystal structure is trigonal.

(10) The material according to any one of items 1 to 9, wherein the material has the formula $SnTi_{1-x}M_xO_3$ with x being in the range of 0 or more and 0.25 or less and M is defined as in item 1.

(11) The material according to any one of items 1 to 10, wherein M is one or more elements selected from the group consisting of Si, Ge, Zr, and Hf, and is preferably one or more elements selected from the group consisting of Zr and Hf.

(12) The material according to any one of items 1 to 11, which has an ilmenite-type derived structure.

(13) The material according to any one of items 1 to 12, wherein the material is free-standing.

(14) A material of the formula $SnTiO_3$ having a tetragonal perovskite-type crystal structure, wherein the Ti(IV) ions are optionally substituted with M, which is one or more elements selected from Group 4 and Group 14 elements.

(15) The material according to item 14, wherein the material has the formula $SnTi_{1-x}M_xO_3$ with x being in the range of 0 or more and 0.25 or less and M is defined as in item 14.

(16) The material according to item 14 or 15, wherein M is one or more elements selected from the group consisting of Si, Ge, Zr, and Hf, and is preferably one or more elements selected from the group consisting of Zr and Hf.

(17) A method for the preparation of $SnTiO_3$, the method comprising the steps of (1) Reacting an alkali metal salt and titanium (IV) oxide to obtain a layered alkali metal titanate;

(2) Ion-exchanging the layered alkali metal titanate with a tin (II) salt to obtain a tin-exchanged alkali metal titanate;

(3) Dehydrating the tin-exchanged alkali metal titanate in an oxygen free atmosphere and subsequently annealing in an oxygen free atmosphere below the temperature at which the disproportionation of tin (II) occurs, thus obtaining $SnTiO_3$, wherein the titanium(IV) oxide is optionally substituted with M, which is one or more elements selected from Group 4 and Group 14 elements.

(18) The method according to item 17, comprising an additional step 4 of washing and drying the $SnTiO_3$.

(19) The method according to item 17 or 18, wherein the reaction in step 1 is performed at a temperature in the range of 400 to 800° C., preferably at 500 to 700° C. and most preferably at 550 to 650° C.

(20) The method according to any one of items 17 to 19, wherein the alkali metal salt used in step 1 is an alkali metal carbonate, preferably $K_2CO_3$.

(21) The method according to any one of items 17 to 20, wherein up to 25 mol % of the titanium of the titanium(IV) oxide used in step 1 is substituted with M.

(22) The method according to any one of items 17 to 21, wherein M is one or more elements selected from the group of Si, Ge, Zr and Hf, and is preferably one or more elements selected from the group consisting of Zr and Hf.

(23) The method according to any one of items 17 to 22, wherein the layered alkali metal titanate is $K_2Ti_2O_5$ or $Li_2TiO_3$.

(24) The method according to any one of items 17 to 23, wherein the ion-exchange in step 2 involves mixing the layered alkali metal titanate and the tin (II) salt, preferably at a temperature of 60° C. or lower.

(25) The method according to item 24, wherein the mixing involves grinding or milling the layered alkali metal titanate and the tin (II) salt.

(26) The method according to any one of items 17 to 25, wherein the ion-exchange in step 2 involves
   combining the layered alkali metal titanate, the tin (II) salt, and an aqueous medium,
   dispersing the layered alkali metal titanate and the tin (II) salt to obtain a dispersion in the aqueous medium, and
   stirring the dispersion at a temperature of 70° C. or lower.

(27) The method according to any one of items 17 to 26, wherein the dehydration in step 3 occurs at a temperature below 250° C., preferably below 200° C.

(28) The method according to any one of items 17 to 27, wherein the dehydration in step 3 gives a water content of below 5 wt %, preferably below 3 wt %, and most preferably below 1 wt %, in terms of the tin-exchanged alkali metal titanate.

(29) The method according to item 27, wherein the dehydration in step 3 involves a first dehydration step 3a at a temperature in the range of 100 to 150° C. and a subsequent second dehydration step 3b at a temperature in the range of above 150 to below 250° C., preferably in the range of above 150 to 200° C.

(30) The method according to any one of items 17 to 29, wherein the annealing in step 3 occurs at a temperature in the range of 250 to 400° C., preferably in the range of 250 to 350° C., and most preferably in the range of 275 to 325° C.

(31) The method according to any one of items 17 to 30, wherein the dehydration and the annealing in step 3 are performed by continuously heating the tin-exchanged alkali metal titanate obtained in step 2 in an oxygen free atmosphere to the annealing temperature with a heating rate of 5° C./min or less, preferably 3° C./min or less, and more preferably 1° C. or less.

(32) The method according to any one of items 17 to 31, wherein the material has the formula $SnTi_{1-x}M_xO_3$ with x being in the range of 0 or more and 0.25 or less.

(33) The method according to any one of items 17 to 32, comprising an additional step of exposing the $SnTiO_3$ to a pressure of 4 GPa or more, preferably 6 GPa or more, more preferably 8 GPa or more, even more preferably 15 GPa or more, and most preferably 20 GPa or more, to obtain $SnTiO_3$ having a perovskite-type structure.

(34) The method according to item 33, comprising an additional step of quenching the $SnTiO_3$ having a perovskite-type structure before the pressure is released so that a phase transition during and after pressure release is suppressed.

(35) A material of the formula $SnTiO_3$ obtainable by the method of preparation of items 17 to 32, wherein Ti is optionally substituted with M, which is one or more elements selected from Group 4 and Group 14 elements.

(36) The material according to item 35, wherein the material has the formula $SnTi_{1-x}M_xO_3$ with x being in the range of 0 or more and 0.25 or less.

(37) The material according to item 35 or 36, wherein
   the material comprises close-packed sub-layers of O ions, which are constituted by two atomic layers of O ions,
   Ti(IV) ions are located in ⅔ of the octahedral voids of the close-packed sub-layers of O ions, and
   Sn(II) ions are located between each adjacent close-packed sub-layers of O ions.

(38) A material of the formula $SnTiO_3$ obtainable by the method of preparation of item 33 or 34, wherein Ti is optionally substituted with M, which is one or more elements selected from Group 4 and Group 14 elements.

(39) The material according to item 38, wherein the material has the formula $SnTi_{1-x}M_xO_3$ with x being in the range of 0 or more and 0.25 or less.

(40) A device, comprising a ferroelectric material, wherein the ferroelectric material comprises at least one material selected from the group of the material of items 1 to 13 and the material of items 14 to 16.

(41) The device according to item 40, wherein the ferroelectric material is the material of items 14 to 16.

(42) Use of the material of any one of items 1 to 13 in a ferroelectric element.

(43) Use of the material of any one of items 14 to 16 in a ferroelectric element.

(44) Use of the material of any one of items 35 to 37 in a ferroelectric element.

(45) Use of the material of item 38 or 39 in a ferroelectric element.

(46) A material of the formula $SnTiO_3$ or $SnTi_{1-x}M_xO_3$ wherein M is one or more elements selected from Group 4 and Group 14 elements and x is in the range of 0 or more and 0.25 or less,
   and wherein the material comprises close-packed layers of O ions, which are constituted by two atomic layers of O ions,
   Ti(IV) ions are located in ⅔ of the octahedral voids of the close-packed layers of O ions, and
   Sn(II) ions are located between each adjacent close-packed sub-layers of O ions.

(47) Use of the material of any one of items 1 to 13 as high-k dielectric.

(48) Use of the material of any one of items 14 to 16 as high-k dielectric.

(49) Use of the material of any one of items 35 to 37 as high-k dielectric.

(50) Use of the material of item 38 or 39 as high-k dielectric.

The invention claimed is:
1. A material of a formula $SnTiO_3$ having a crystal structure comprised of layers,
wherein
   the layers comprise Sn(II) ions, Ti(IV) ions and edge-sharing $O_6$-octahedra,
   wherein the edge-sharing $O_6$-octahedra form a sub-layer,
   the Ti(IV) ions are located within ⅔ of the edge-sharing $O_6$-octahedra, thus forming edge-sharing $TiO_6$-octahedra, wherein the edge-sharing $TiO_6$-octahedra form a honeycomb structure within the sub-layer,
wherein the honeycomb structure comprises hexagons with Ti(IV)-vacancies within the hexagons,
the Sn(II) ions are located above and below the Ti(IV)-vacancies with respect to the sub-layer,
the Ti(IV) ions are optionally substituted with M,
wherein M is one or more elements selected from Group 4 and Group 14 elements, and
wherein the crystal structure satisfies at least one of the following features (i) and (ii):
(i) the Sn(II) ions have a tetrahedral coordination sphere involving three O ions of the layer and the electron lone pair of the Sn(II) ions, which is situated at an apical position relative to the three O ions of the layer,
(ii) the layers are stacked so that each layer is translated relative to each adjacent layer by a stacking vector S1 or a stacking vector S2,
wherein centers of adjacent hexagons form a parallelogram with a side having a length x and a side having a length y,
wherein the stacking vector S1 is a combined translation along the side having the length x by ⅔ x and along the side having a length y by ⅓ y,
wherein the stacking vector S2 is a combined translation along the side having the length x by ⅓ x and along the side having a length y by ⅔ y,
and wherein the crystal structure comprises layers translated relative to adjacent layers by the stacking vector S1 and layers translated relative to adjacent layers by the stacking vector S2.

2. The material according to claim 1, wherein a ratio of a recurrence of the translation of a layer relative to an adjacent layer by the stacking vector S1 to a recurrence of the translation of a layer relative to an adjacent layer by the stacking vector S2 is in the range of 0.1 to 9.

3. The material according to claim 1, wherein the O ions of the edge-sharing $O_6$-octahedra within the sub-layer are close-packed and do not form a close packing with O ions of adjacent layers.

4. The material according to claim 1, wherein the Ti(IV)-vacancies are surrounded by six edge-sharing $TiO_6$-octahedra.

5. The material according to claim 1, wherein the material has a formula of $SnTi_{1-x}M_xO_3$ with x being in a range of 0 or more and 0.25 or less and wherein M is defined as in claim 1.

6. A device comprising a ferroelectric material, wherein the ferroelectric material comprises at least one material as defined in claim 1.

7. A ferroelectric element comprising the material of claim 1.

8. A high-k dielectric comprising the material of claim 1.

9. A method for a preparation of $SnTiO_3$, the method comprising the steps of
(1) reacting an alkali metal salt and titanium (IV) oxide to obtain a layered alkali metal titanate;
(2) ion-exchanging the layered alkali metal titanate with a tin (II) salt to obtain a tin-exchanged alkali metal titanate;
(3) dehydrating the tin-exchanged alkali metal titanate in an oxygen-free atmosphere and subsequently annealing in an oxygen-free atmosphere below a temperature at which a disproportionation of tin (II) occurs, thus obtaining $SnTiO_3$,
wherein titanium of the titanium(IV) oxide is optionally substituted with M, which is one or more elements selected from Group 4 and Group 14 elements.

10. The method according to claim 9, wherein the reaction in step 1 is performed at a temperature range of 400 to 800° C.

11. The method according to claim 9, wherein the method satisfies at least one of the following features (i) to (iii):
(i) the alkali metal salt used in step 1 is an alkali metal carbonate,
(ii) the layered alkali metal titanate obtained in step 1 is $K_2Ti_2O_5$ or $Li_2TiO_3$;
(iii) the ion-exchange in step 2 comprises mixing the layered alkali metal titanate and the tin (II) salt.

12. The method of claim 11, wherein the mixing of the layered alkali metal titanate and the tin (II) salt is at a temperature of 60° C. or lower.

13. The method according to claim 9, wherein the method satisfies at least one of the following features (i) and (ii):
(i) the dehydration in step 3 occurs at a temperature below 250° C.;
(ii) the annealing in step 3 occurs at a temperature in the range of 250 to 400° C.

14. The method according to claim 9, wherein the dehydration and the annealing in step 3 are performed by continuously heating the tin-exchanged alkali metal titanate obtained in step 2 in an oxygen-free atmosphere to an annealing temperature with a heating rate of 5° C./min or less.

15. The method according to claim 9, comprising an additional step of exposing the $SnTiO_3$ to a pressure of 4 GPa or more to obtain $SnTiO_3$ having a perovskite-type structure.

16. A material having a formula of $SnTiO_3$ obtainable by the method of preparation according to claim 9, wherein Ti is optionally substituted with M, which is one or more elements selected from Group 4 and Group 14 elements.

* * * * *